United States Patent
Li et al.

(10) Patent No.: US 12,211,438 B2
(45) Date of Patent: Jan. 28, 2025

(54) DISPLAY SUBSTRATE HAVING PIXEL CIRCUITS, AND DISPLAY PANEL

(71) Applicants: HEFEI BOE JOINT TECHNOLOGY CO., LTD., Hefei (CN); BOE TECHNOLOGY GROUP CO., LTD., Beijing (CN)

(72) Inventors: Yongqian Li, Beijing (CN); Can Yuan, Beijing (CN); Zhongyuan Wu, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/789,938

(22) PCT Filed: Jul. 9, 2021

(86) PCT No.: PCT/CN2021/105483
§ 371 (c)(1),
(2) Date: Jan. 12, 2023

(87) PCT Pub. No.: WO2023/279373
PCT Pub. Date: Jan. 12, 2023

(65) Prior Publication Data
US 2024/0177663 A1 May 30, 2024

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0408* (2013.01);
(Continued)

(58) Field of Classification Search
CPC ......... G09G 3/3233; G09G 2300/0408; G09G 2300/0452; G09G 2300/0819;
(Continued)

(56) References Cited

U.S. PATENT DOCUMENTS 8,963,907 B2   2/2015   Tsai et al.
9,183,777 B2   11/2015  Yamashita et al.
(Continued)

FOREIGN PATENT DOCUMENTS

CN   102436793 B   3/2014
CN   101739952 B   1/2016
(Continued)

OTHER PUBLICATIONS

Extended European Search Report from European Application No. 21948867.3; Mailing Date: Oct. 17, 2024.

*Primary Examiner* — David D Davis
(74) *Attorney, Agent, or Firm* — Dilworth & Barrese, LLP.; Michael J. Musella, Esq.

(57) ABSTRACT

A display substrate and a display panel are provided. The display substrate includes: a base substrate; and a plurality of sub-pixels. Each sub-pixel includes a light-emitting element and a pixel circuit; the pixel circuit includes a driving circuit, a data writing circuit, a first control circuit, a second control circuit, and a light-emitting control circuit; the driving circuit is configured to control the driving current flowing through the light-emitting element; the light-emitting control circuit is configured to apply the driving current to the light-emitting element; the first control circuit is configured to write a reference voltage into the driving circuit; the second control circuit is configured to write an initial voltage into the first electrode of the light-emitting element; and orthographic projections of at least part of
(Continued)

pixel circuits of every two adjacent sub-pixels in a same row of sub-pixels on the base substrate are mirror-symmetrical.

20 Claims, 14 Drawing Sheets

(52) U.S. Cl.
CPC ............... *G09G 2300/0452* (2013.01); *G09G 2300/0819* (2013.01); *G09G 2300/0842* (2013.01); *G09G 2300/0861* (2013.01); *G09G 2310/08* (2013.01)

(58) Field of Classification Search
CPC ... G09G 2300/0842; G09G 2300/0861; G09G 2310/08; H10K 59/131
See application file for complete search history.

(56) References Cited

U.S. PATENT DOCUMENTS

| | | | |
|---|---|---|---|
| 10,269,300 B2 | 4/2019 | Xiang et al. | |
| 10,978,001 B2 * | 4/2021 | In | G09G 3/3291 |
| 10,984,727 B2 | 4/2021 | Chang et al. | |
| 11,081,047 B2 | 8/2021 | Xu et al. | |
| 2019/0088208 A1 | 3/2019 | Chang et al. | |
| 2020/0006446 A1 | 1/2020 | Lee et al. | |
| 2021/0074800 A1 * | 3/2021 | Nakagawa | H10K 59/353 |
| 2021/0167161 A1 | 6/2021 | Yang et al. | |
| 2021/0210022 A1 | 7/2021 | Chang et al. | |
| 2022/0343842 A1 | 10/2022 | Yu | |
| 2022/0398977 A1 | 12/2022 | Xue et al. | |

FOREIGN PATENT DOCUMENTS

| | | | | |
|---|---|---|---|---|
| CN | 106710525 A | | 5/2017 | |
| CN | 106991956 A | | 7/2017 | |
| CN | 108335631 A | | 7/2018 | |
| CN | 109410835 A | | 3/2019 | |
| CN | 110969988 A | | 4/2020 | |
| CN | 111052212 A | | 4/2020 | |
| CN | 111128080 A | * | 5/2020 | ........... G09G 3/3233 |
| CN | 111261109 A | | 6/2020 | |
| CN | 111429842 A | | 7/2020 | |
| CN | 111477178 A | | 7/2020 | |
| CN | 112071882 A | | 12/2020 | |
| CN | 112259049 A | | 1/2021 | |
| WO | WO-2019187077 A1 | * | 10/2019 | ......... H01L 27/3213 |

* cited by examiner

|  | Scheme 1 | Present disclosure | | |
| --- | --- | --- | --- | --- |
|  | Reference voltage Vref=3.5 | Reference voltage Vref=3.5V | | |
|  | T=110us | T=110us | T=130us | T=150us |
| Threshold voltage | I_oled(nA) | I_oled(nA) | I_oled(nA) | I_oled(nA) |
| 0.5 | 96.43 | 83.94 | 76.24 | 70.58 |
| 1 | 94.76 | 81.03 | 73.59 | 68.08 |
| 1.5 | 92.92 | 78.88 | 71.94 | 66.74 |
| 2 | 90.93 | 74.37 | 68.28 | 63.68 |
| 2.5 | 83.55 | 65.28 | 60.99 | 57.67 |
| Uniformity | 86.64% | 78% | 80% | 81.7% |

440

470

DISPLAY SUBSTRATE HAVING PIXEL CIRCUITS, AND DISPLAY PANEL

TECHNICAL FIELD

Embodiments of the present disclosure relate to a display substrate and a display panel.

BACKGROUND

With the rapid development of organic light-emitting diode (OLED) in the display field, people have higher and higher requirements for display effects. Due to the advantages such as high display quality and the like, the application range of the high-resolution display device is becoming wider and wider. In the display field, the key technology is the design of the pixel circuit.

SUMMARY

At least one embodiment of the present disclosure provides a display substrate, which comprises: a base substrate and a plurality of sub-pixels on the base substrate. The plurality of sub-pixels are arranged in a plurality of rows and a plurality of columns, each sub-pixel comprises a light-emitting element and a pixel circuit for driving the light-emitting element to emit light, and the light-emitting element is configured to emit light according to a driving current that is received. The pixel circuit comprises a driving circuit, a data writing circuit, a storage circuit, a first control circuit, a second control circuit, and a light-emitting control circuit. The driving circuit comprises a control end, a first end, and a second end, and is configured to control the driving current flowing through the light-emitting element. The first end of the driving circuit receives a first voltage of a first voltage line, and the second end of the driving circuit is connected to the light-emitting control circuit. The data writing circuit is connected to the control end of the driving circuit, and is configured to write a data signal into the control end of the driving circuit in response to a first scan signal. A first end of the light-emitting control circuit is connected to the second end of the driving circuit, a second end of the light-emitting control circuit is connected to a first electrode of the light-emitting element, and the light-emitting control circuit is configured to apply the driving current to the light-emitting element in response to a light-emitting control signal. A first end of the storage circuit is connected to the control end of the driving circuit, a second end of the storage circuit is connected to the second end of the light-emitting control circuit, and the storage circuit is configured to store the data signal written by the data writing circuit. The first control circuit is connected to the control end of the driving circuit, and is configured to write a reference voltage into the control end of the driving circuit in response to a second scan signal. The second control circuit is connected to the first electrode of the light-emitting element, and is configured to write an initial voltage into the first electrode of the light-emitting element in response to a third scan signal. Orthographic projections of at least part of pixel circuits of every two adjacent sub-pixels in a same row of the plurality of sub-pixels on the base substrate are mirror-symmetrical.

For example, in some embodiments of the present disclosure, the plurality of sub-pixels are divided into a plurality of pixel units, each pixel unit comprises three adjacent sub-pixels located in a same row, and each pixel unit comprises a first sub-pixel, a second sub-pixel, and a third sub-pixel arranged in sequence along a first direction. A data writing circuit in a pixel circuit of the first sub-pixel is connected to a first data line to receive a corresponding data signal. A data writing circuit in a pixel circuit of the second sub-pixel is connected to a second data line to receive a corresponding data signal. A data writing circuit in a pixel circuit of the third sub-pixel is connected to a third data line to receive a corresponding data signal. The first data line, the second data line, and the third data line are parallel to each other and extend in a second direction, and the second direction is perpendicular to the first direction. An orthographic projection of the pixel circuit of the first sub-pixel and an orthographic projection of the pixel circuit of the second sub-pixel on the base substrate are mirror-symmetrical with respect to a center line between the first data line and the second data line. The orthographic projection of the pixel circuit of the second sub-pixel and an orthographic projection of the pixel circuit of the third sub-pixel on the base substrate are mirror-symmetrical with respect to a center line between the second data line and the third data line.

For example, in come embodiments of the present disclosure, the first data line is on a side of the first sub-pixel away from the second sub-pixel, and the second data line and the third data line are between the second sub-pixel and the third sub-pixel: or the first data line and the second data line are between the first sub-pixel and the second sub-pixel, and the third data line is on a side of the third sub-pixel away from the second sub-pixel.

For example, in come embodiments of the present disclosure, for two pixel units that are adjacent and located in a same row, distribution positions of multi-line patterns formed by the first data line, the second data line, and the third data line in the two pixel units are mirror-symmetrical.

For example, in some embodiments of the present disclosure, the first voltage line comprises a first voltage main line and a first voltage bridging line. The first voltage main line extends along a second direction and is parallel to a first data line, a second data line, and a third data line. The first voltage bridging line extends along a first direction. The first voltage bridging line is connected to the first voltage main line through a first hole. The first voltage bridging line is configured to provide the first voltage to two rows of the plurality of sub-pixels respectively on two sides of the first voltage bridging line and adjacent to the first voltage bridging line.

For example, in come embodiments of the present disclosure, the second control circuit comprises a first end and a second end, the first end of the second control circuit is connected to the first electrode of the light-emitting element, and the second end of the second control circuit is connected to an initial signal line to receive the initial voltage, and the initial signal line is parallel to the first voltage bridging line, and is between an orthographic projection of the first voltage bridging line on the base substrate and an orthographic projection of the second control circuit on the base substrate.

For example, in come embodiments of the present disclosure, the second control circuit comprises a first transistor, the first transistor comprises a gate electrode, and the gate electrode of the first transistor is connected to a third scan line to receive the third scan signal, the third scan line is parallel to the first voltage bridging line, and is on a side of the initial signal line away from the first voltage bridging line, the first transistor comprises an active layer, and an orthographic projection of at least portion of the active layer of the first transistor on the base substrate is between an orthographic projection of the third scan line on the base substrate and an orthographic projection of the initial signal line on the base substrate.

For example, in come embodiments of the present disclosure, the first voltage line further comprises a plurality of first voltage transfer portions, each first voltage transfer portion of the plurality of first voltage transfer portions is configured to provide the first voltage to two sub-pixels that are located in a same column, on the two sides of the first voltage bridging line, and adjacent to the first voltage bridging line, each first voltage transfer portion extends along the second direction and is connected to the first voltage bridging line through a second hole, the first voltage transfer portion comprises a first end and a second end, the first end of the first voltage transfer portion and the second end of the first voltage transfer portion are on different sides of the first voltage bridging line, the first end of the first voltage transfer portion is connected to sub-pixels on a side of the first voltage bridging line, and the second end of the first voltage transfer portion is connected to sub-pixels on another side of the first voltage bridging line.

For example, in come embodiments of the present disclosure, an orthographic projection of the first voltage transfer portion on the base substrate overlaps with the orthographic projection of the initial signal line on the base substrate and the orthographic projection of the third scan line on the base substrate.

For example, in come embodiments of the present disclosure, the light-emitting control circuit comprises a control end, and the control end of the light-emitting control circuit is connected to a control signal line to receive the light-emitting control signal, the control signal line is parallel to the first voltage bridging line, and the control signal line is on a side of the third scan line away from the first voltage bridging line.

For example, in come embodiments of the present disclosure, the control signal line and the third scan line are on different sides of an orthographic projection of the driving circuit on the base substrate.

For example, in come embodiments of the present disclosure, the storage circuit comprises a first capacitor plate and a second capacitor plate, and an orthographic projection of the first capacitor plate on the base substrate is between the orthographic projection of the third scan line on the base substrate and an orthographic projection of the control signal line on the base substrate, the orthographic projection of the first capacitor plate on the base substrate at least partially overlaps an orthographic projection of the second capacitor plate on the base substrate, the driving circuit comprises a second transistor, the second transistor comprises a gate electrode, and the first capacitor plate serves as the gate electrode of the second transistor.

For example, in come embodiments of the present disclosure, the data writing circuit comprises a control end, and the control end of the data writing circuit is connected to a first scan line to receive the first scan signal, the first scan line is parallel to the first voltage bridging line, and the first scan line is on a side of the control signal line away from the first voltage bridging line.

For example, in come embodiments of the present disclosure, the data writing circuit comprises a third transistor, the third transistor comprises an active layer, and an orthographic projection of the active layer of the third transistor on the base substrate is between an orthographic projection of the first scan line on the base substrate and the orthographic projection of the control signal line on the base substrate.

For example, in come embodiments of the present disclosure, the first control circuit comprises a control end, and the control end of the first control circuit is connected to a second scan line to receive the second scan signal, the second scan line is parallel to the first voltage bridging line, and the second scan line is on a side of the first scan line away from the first voltage bridging line.

For example, in come embodiments of the present disclosure, the first control circuit comprises a fourth transistor, the fourth transistor comprises an active layer, and an orthographic projection of the active layer of the fourth transistor on the base substrate is between the orthographic projection of the first scan line on the base substrate and an orthographic projection of the second scan line on the base substrate.

For example, in come embodiments of the present disclosure, the first control circuit further comprises a first end and a second end, the first end of the first control circuit is connected to a reference voltage line to receive the reference voltage, and the second end of the first control circuit is connected to the control end of the driving circuit, the reference voltage line comprises a reference voltage main line and a reference voltage bridging line, the reference voltage main line extends along the second direction and is parallel to the first voltage main line, the reference voltage bridging line extends along the first direction, the reference voltage bridging line is connected to the reference voltage main line through a third hole, and the reference voltage bridging line is connected to first control circuits of a plurality of sub-pixels in a same row and is configured to provide the reference voltage to the first control circuits of the plurality of sub-pixels in the same row.

For example, in come embodiments of the present disclosure, the plurality of sub-pixels in the same row have a center line extending along the second direction, and the reference voltage main line overlaps with the center line.

For example, in come embodiments of the present disclosure, the reference voltage bridging line is configured to provide the reference voltage to respective first control circuits of six sub-pixels in a same row.

For example, in come embodiments of the present disclosure, the reference voltage bridging line is on a side of the second scan line away from the first voltage bridging line.

For example, in come embodiments of the present disclosure, a second end of the first control circuit and the first capacitor plate are connected to a second end of the data writing circuit through a first bridging portion, the first bridging portion extends along the second direction and is connected to the second end of the data writing circuit through a fourth hole, an orthographic projection of the first bridging portion on the base substrate overlaps with an orthographic projection of a first scan line on the base substrate and the orthographic projection of the control signal line on the base substrate, the first bridging portion comprises a first end and a second end, the first end of the first bridging portion is on a side of the first scan line away from the control signal line and is connected to the second end of the first control circuit, and the second end of the first bridging portion is on a side of the control signal line away from the first scan line and is connected to the first capacitor plate.

For example, in come embodiments of the present disclosure, an extension line of the first bridging portion in the second direction overlaps with an extension line of the first voltage transfer portion in the second direction.

For example, in come embodiments of the present disclosure, orthographic projections of pixel circuits of two adjacent sub-pixels in a same column on the base substrate are mirror-symmetrical with respect to a first symmetry line, distributions of the reference voltage bridging line, the initial signal line, the second scan line, the first scan line, the control signal line, and the third scan line in the two adjacent sub-pixels in the same column are mirror-symmetrical with respect to the first symmetry line, in the case where the first voltage bridging line is between the two adjacent sub-pixels in the same column, the first symmetry line overlaps with the first voltage bridging line, alternatively, in the case where the first voltage bridging line is not between the two adjacent sub-pixels in the same column, the first symmetry line is a center line of first voltage bridging lines respectively connected to the two adjacent sub-pixels in the same column.

For example, in come embodiments of the present disclosure, the plurality of sub-pixels are divided into a plurality of pixel units, each pixel unit comprises three adjacent sub-pixels in a same row, the display substrate is provided with a plurality of first voltage main lines distributed at intervals, and one pixel unit is provided between every two adjacent first voltage main lines.

For example, in come embodiments of the present disclosure, the second end of the light-emitting control circuit is connected to a first transfer line through a fifth hole and a sixth hole in sequence, and the first transfer line is connected to a first end of the second control circuit through a seventh hole and an eighth hole in sequence, an orthographic projection of the fifth hole on the base substrate and an orthographic projection of the sixth hole on the base substrate are adjacent to each other, and the fifth hole and the sixth hole are distributed along a first direction, and an orthographic projection of the seventh hole on the base substrate and an orthographic projection of the eighth hole on the base substrate are adjacent to each other, and the seventh hole and the eighth hole are distributed along a second direction.

For example, in come embodiments of the present disclosure, the light-emitting control circuit comprises a fifth transistor, and each selected from a group consisting of the first transistor, the second transistor, the third transistor, the fourth transistor, and the fifth transistors comprises an active layer, orthographic projections of active layers of the first transistor, the second transistor, the third transistor, the fourth transistor, and the fifth transistor on the base substrate form a transistor pattern: and transistor patterns of every two adjacent sub-pixels in a same row of the plurality of sub-pixels are mirror-symmetrical.

For example, in come embodiments of the present disclosure, the first electrode of the light-emitting element covers a corresponding sub-pixel.

For example, in come embodiments of the present disclosure, the first electrode of the light-emitting element is connected to the first end of the second control circuit through an anode connection portion, the anode connection portion extends along the second direction, the anode connection portion comprises a first end and a second end, the first end of the anode connection portion is on a side of the third scan line close to the first capacitor plate, the second end of the anode connection portion is on a side of the third scan line away from the first capacitor plate, the first end of the anode connection portion is connected to the first end of the second control circuit through a ninth hole, and an orthographic projection of the anode connection portion on the base substrate overlaps with the orthographic projection of the third scan line on the base substrate.

Another aspect of the present disclosure provides a display panel, which comprises the display substrate provided by any embodiment of the present disclosure.

BRIEF DESCRIPTION OF THE DRAWINGS

In order to clearly illustrate the technical solutions of the embodiments of the present disclosure, the drawings of the embodiments will be briefly described in the following: it is obvious that the described drawings are only related to some embodiments of the present disclosure and thus are not limitative to the present disclosure.

DETAILED DESCRIPTION

Figure 1A:
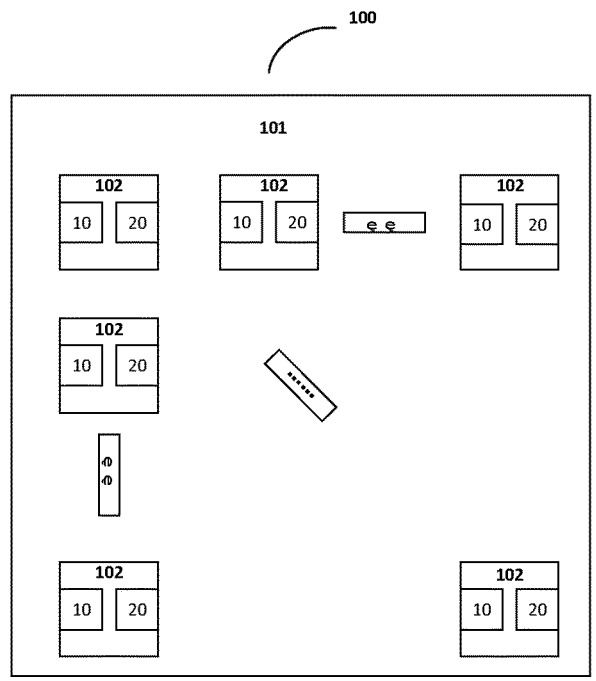
FIG. 1A is a schematic block diagram of a display substrate provided by some embodiments of the present disclosure.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following description of the embodiments of the present disclosure clear and concise, the present disclosure omits the detailed description of some well-known functions and well-known components.

In the display field, there are various types of pixel circuits used to drive the OLED, such as a 2T1C circuit consisting of two thin-film transistors (TFTs) and one capacitor (C), or a 4T1C circuit and a 4T2C circuit having a threshold voltage compensation function. For better compensation, the amount of transistors in the pixel circuit can be increased, but with the increase of the complexity of the pixel circuit and the increase of the amount of the transistors, the difficulty of layout design increases, and interference between signals may occur. At least some embodiments of the present disclosure provide a display substrate and a display panel, and the display substrate comprises: a base substrate: and a plurality of sub-pixels arranged on the base substrate. The plurality of sub-pixels are arranged in a plurality of rows and a plurality of columns, each sub-pixel includes a light-emitting element and a pixel circuit that drives the light-emitting element to emit light, and the light-emitting element is configured to emit light according to a driving current that is received: the pixel circuit includes a driving circuit, a data writing circuit, a storage circuit, a first control circuit, a second control circuit, and a light-emitting control circuit: the driving circuit includes a control end, a first end, and a second end, and is configured to control the driving current flowing through the light-emitting element, the first end of the driving circuit receives a first voltage of a first voltage line, the second end of the driving circuit is connected to the light-emitting control circuit: the data writing circuit is connected to the control end of the driving circuit, and is configured to write a data signal into the control end of the driving circuit in response to a first scan signal: a first end of the light-emitting control circuit is connected to the second end of the driving circuit, a second end of the light-emitting control circuit is connected to a first electrode of the light-emitting element, and the light-emitting control circuit is configured to apply the driving current to the light-emitting element in response to a light-emitting control signal: a first end of the storage circuit is connected to the control end of the driving circuit, a second end of the storage circuit is connected to the second end of the light-emitting control circuit, and the storage circuit is configured to store the data signal written by the data writing circuit: the first control circuit is connected to the control end of the driving circuit, and is configured to write a reference voltage into the control end of the driving circuit in response to a second scan signal; the second control circuit is connected to the first electrode of the light-emitting element, and is configured to write an initial voltage into the first electrode of the light-emitting element in response to a third scan signal: and orthographic projections of at least part of pixel circuits of every two adjacent sub-pixels in the same row of sub-pixels on the base substrate are mirror-symmetrical.

In the display substrate provided by the embodiments of the present disclosure, by connecting the light-emitting control circuit with the driving circuit, the multiplexing design of the data driver can be compatible, in addition, the light-emitting control circuit is connected between the driving circuit and the light-emitting element, while ensuring the control effect, the current compensation capability, and the compensation accuracy, the display substrate has a simple structure, is easy to design and manufacture, and has a low cost.

Several embodiments of the present disclosure are described in detail below with reference to the accompanying drawings, but the present disclosure is not limited to these specific embodiments.

Figure 1B:
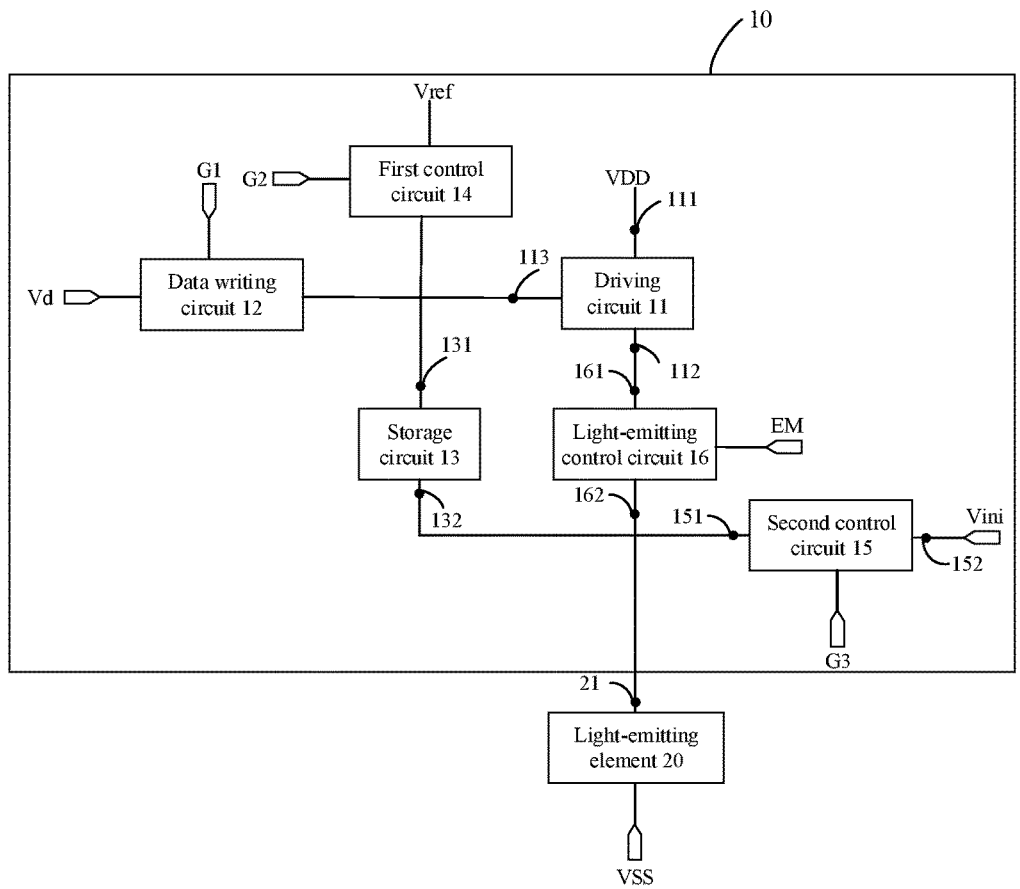
FIG. 1B is a schematic block diagram of a pixel circuit provided by some embodiments of the present disclosure.

FIG. 1A is a schematic block diagram of a display substrate provided by some embodiments of the present disclosure: and FIG. 1B is a schematic block diagram of a pixel circuit provided by some embodiments of the present disclosure.

For example, as illustrated in FIG. 1A, a display substrate 100 provided by an embodiment of the present disclosure includes a base substrate 101 and a plurality of sub-pixels 102 disposed on the base substrate 101.

For example, the display substrate 100 may be applied to a display panel such as an active matrix organic light-emitting diode (AMOLED) display panel and the like. The display substrate 100 may be an array substrate.

For example, the base substrate 101 may be a flexible substrate or a rigid substrate. For example, the base substrate 101 may be made of glass, plastic, quartz, or other suitable materials, and the embodiments of the present disclosure do not limit this.

As illustrated in FIG. 1A, for example, the plurality of sub-pixels 102 are arranged in a plurality of rows and a plurality of columns to form a pixel array. For example, each sub-pixel 102 includes a pixel circuit 10 and a light-emitting element 20, and the light-emitting element 20 is located on a side of the pixel circuit 10 away from the base substrate 101. The light-emitting element 20 is configured to emit light according to a driving current that is received.

For example, the pixel circuit 10 is configured to drive the light-emitting element 20 to emit light. The pixel circuit and its working principle are described below with reference to FIG. 1B and FIG. 1C.

For example, as illustrated in FIG. 1B, each pixel circuit 10 includes a driving circuit 11, a data writing circuit 12, a storage circuit 13, a first control circuit 14, a second control circuit 15, and a light-emitting control circuit 16.

The driving circuit 11 includes a control end 113, a first end 111, and a second end 112, and is configured to control the driving current flowing through the light-emitting element. The first end 111 of the driving circuit 11 receives a first voltage of a first voltage line VDD, and the second end 112 of the driving circuit 11 is connected to the light-emitting control circuit 16. For example, in some examples, the first end 111 of the driving circuit 11 may be directly connected to the first voltage line VDD. For example, in other examples, the first end 111 of the driving circuit 11 may also be connected to the first voltage line VDD via other elements.

The data writing circuit 12 is connected to the control end 113 of the driving circuit 11 and is configured to write a data signal into the control end 113 of the driving circuit 11 in response to a first scan signal. For example, the data writing circuit 12 is connected to a data line Vd to receive the data signal, and the data signal may be a voltage signal. The data writing circuit 12 is also connected to a first scan line G1 to receive the first scan signal.

A first end 161 of the light-emitting control circuit 16 is connected to the second end 112 of the driving circuit 11, a second end 162 of the light-emitting control circuit 16 is connected to the first electrode 21 of the light-emitting element 20, and the light-emitting control circuit 16 is configured to apply the driving current to the light-emitting element 20 in response to a light-emitting control signal. For example, the light-emitting control circuit 16 is connected to a control signal line EM to receive the light-emitting control signal.

A first end 131 of the storage circuit 13 is connected to the control end 113 of the driving circuit 11, a second end 132 of the storage circuit 13 is connected to the second end 162 of the light-emitting control circuit 16, and the storage circuit 13 is configured to store the data signal written by the data writing circuit 12.

The first control circuit 14 is connected to the control end 113 of the driving circuit 11 and is configured to write a reference voltage into the control end 113 of the driving circuit 11 in response to a second scan signal. For example, the first control circuit 14 is connected to a reference voltage line Vref to receive the reference voltage. The first control circuit 14 is also connected to a second scan line G2 to receive the second scan signal.

The second control circuit 15 is connected to the first electrode 21 of the light-emitting element 20 and is configured to write an initial voltage into the first electrode 21 of the light-emitting element 20 in response to a third scan signal. For example, the second control circuit 15 is connected to an initial voltage line Vini to receive the initial voltage, and the second control circuit 15 is connected to a third scan line G3 to receive the third scan signal.

As illustrated in FIG. 1B, a second electrode of the light-emitting element 20 may be connected to a second voltage line VSS to receive a second voltage from the second voltage line VSS.

Figure 2A:
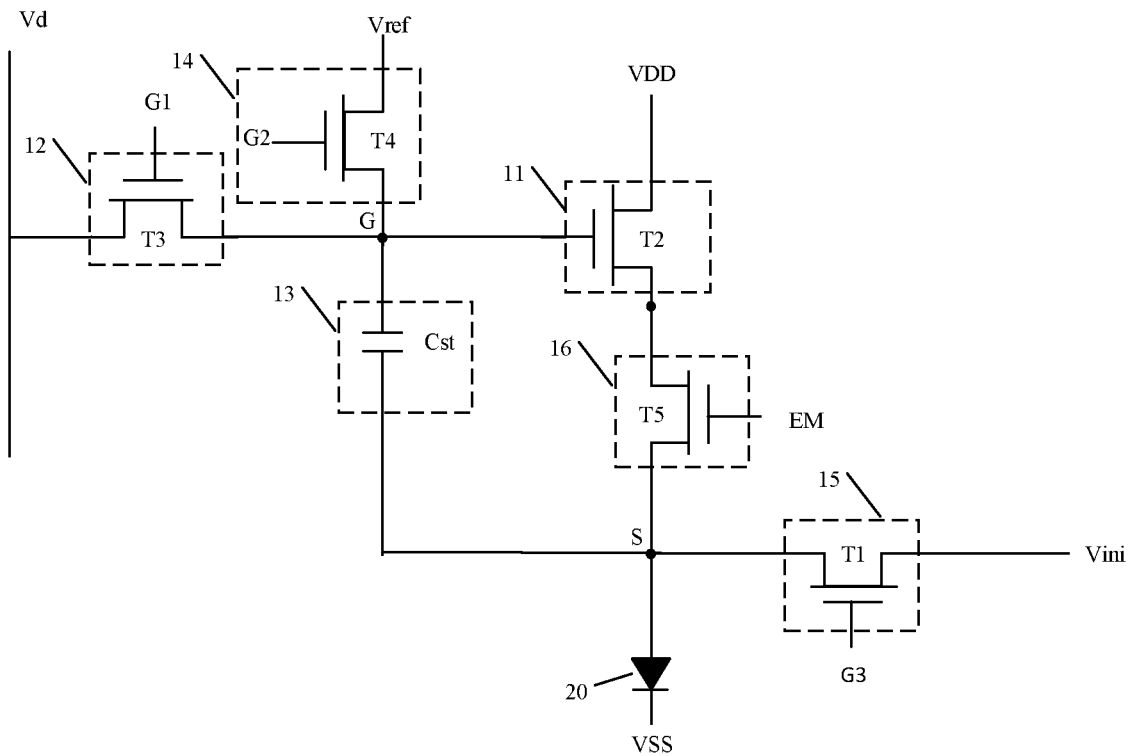
FIG. 2A is a schematic diagram of a specific example of the pixel circuit illustrated in FIG. 1B.

FIG. 2A is a schematic diagram of a specific example of the pixel circuit illustrated in FIG. 1B. As illustrated in FIG. 2A, the driving circuit 11 may include a second transistor T2, the data writing circuit 12 may include a third transistor T3, the first control circuit 14 may include a fourth transistor T4, the second control circuit 15 may include a first transistor T1, and the light-emitting control circuit 16 may include a fifth transistor T5. The storage circuit 13 may include a storage capacitor Cst, the storage capacitor Cst includes two capacitor plates that are stacked, and the structure of the capacitor plates is described later, and is not described in detail here.

As illustrated in FIG. 2A, for example, the first to fifth transistors T1 to T5 may be N-type transistors. For example, a gate electrode of the second transistor T2 serves as the control end 113 of the driving circuit 11, a first electrode of the second transistor T2 serves as the first end 111 of the driving circuit 11, and a second electrode of the second transistor T2 serves as the second end 112 of the driving circuit 11. The first electrode of the second transistor T2 is connected to the first voltage line VDD.

A gate electrode of the third transistor T3 is connected to the first scan line G1 to receive the first scan signal, a first electrode of the third transistor T3 serves as the first end of the third transistor T3 and is connected to the data line Vd to receive the data signal, and a second electrode of the third transistor T3 serves as the second end of the third transistor T3 and is connected to the gate electrode of the second transistor T2.

A gate electrode of the fourth transistor T4 is connected to the second scan line G2 to receive the second scan signal, a second electrode of the fourth transistor T4 serves as the second end of the fourth transistor T4 and is connected to the gate electrode of the second transistor T2, and a first electrode of the fourth transistor T4 serves as the first end of the fourth transistor T4 and is connected to the reference voltage line Vref.

One capacitor plate of the two capacitor plates of the storage capacitor Cst serves as the first end of the storage circuit 13, and the other capacitor plate of the two capacitor plates of the storage capacitor Cst serves as the second end of the storage circuit 13. That is, the first electrode of the storage capacitor Cst serves as the first end of the storage circuit 13 and is connected to the gate electrode of the second transistor T2, and the second electrode of the storage capacitor Cst serves as the second end of the storage circuit 13 and is connected to the first electrode of the light-emitting element 20.

For example, the gate electrode of the second transistor T2, the second electrode of the fourth transistor T4, the second electrode of the third transistor T3, and the first electrode of the storage capacitor Cst can be connected to a first node G.

A gate electrode of the fifth transistor T5 can be used as the control end of the light-emitting control circuit 16, a first electrode of the fifth transistor T5 can be used as the first end of the light-emitting control circuit 16 and is connected to the second electrode of the second transistor T2, and a second electrode of the fifth transistor T5 can be used as the second end of the light-emitting control circuit 16 and is connected to the first electrode of the light-emitting element 20.

A gate electrode of the first transistor T1 is connected to the third scan line G3 to receive the third scan signal, a first electrode of the first transistor T1 serves as the first end of the second control circuit 15 and is connected to the first electrode of the light-emitting element 20, and a second electrode of the first transistor T1 serves as the second end of the second control circuit 15 and is connected to the initial signal line Vini to receive the initial voltage.

For example, the second electrode of the fifth transistor T5, the first electrode of the first transistor T1, the second electrode of the storage capacitor Cst, and the first electrode of the light-emitting element 20 are connected to a second node S.

For example, as illustrated in FIG. 2A, the second electrode of the light-emitting element 20 is electrically connected to the second voltage line VSS to receive the second voltage.

For example, the light-emitting element 20 may be a light-emitting diode or the like. The light-emitting diode may be a micro light-emitting diode (Micro LED), an organic light-emitting diode (OLED), or a quantum dot light-emitting diode (QLED), and the like. The light-emitting element 20 is configured to receive a light-emitting signal (for example, a driving current) during operation, and emit light with an intensity corresponding to the light-emitting signal. The light-emitting element 20 may include a first electrode, a second electrode, and a light-emitting layer disposed between the first electrode and the second electrode. The first electrode of the light-emitting element 20 may be an anode, and the second electrode of the light-emitting element 20 may be a cathode. It should be noted that, in the embodiments of the present disclosure, the light-emitting layer of the light-emitting element may include an electroluminescent layer itself and other common layers on both sides of the electroluminescent layer, such as a hole injection layer, a hole transport layer, an electron injection layer, an electron transport layer, and the like. Generally, the light-emitting element 20 has a light-emitting threshold voltage, and emits light when the voltage between the first electrode and the second electrode of the light-emitting element 20 is greater than or equal to the light-emitting threshold voltage. In practical applications, the specific structure of the light-emitting element 20 can be designed and determined according to the actual application environment, which is not limited herein.

For example, the first transistor T1 to the fifth transistor T5 are N-type thin film transistors (TFTs).

For example, one of the voltage output by the first voltage line VDD and the voltage output by the second voltage line VSS is a high voltage, and the other is a low voltage. For example, in the embodiment illustrated in FIG. 2A, the voltage output by the first voltage line VDD is a constant first voltage, and the first voltage is a positive voltage: and the voltage output by the second voltage line VSS is a constant second voltage, and the second voltage is a negative voltage, or the like. For example, in some examples, the second voltage line VSS may be grounded.

It should be noted that the transistors used in the embodiments of the present disclosure may be thin film transistors, field effect transistors, or other switching devices with the same characteristics, and the thin film transistors may include oxide semiconductor thin film transistors, amorphous silicon thin film transistors, polysilicon thin film transistors, or the like. The source electrode and the drain electrode of the transistor can be symmetrical in structure, so that the source electrode and the drain electrode of the transistor can be indistinguishable in physical structure. In the embodiments of the present disclosure, in order to distinguish the transistor, in addition to the gate electrode which serves as the control electrode, one of the two electrodes is directly described as the first electrode and the other electrode of the two electrodes is the second electrode. Therefore, in the embodiments of the present disclosure, the first electrode and the second electrode of all or part of the transistors may be interchanged as required.

The working process of the pixel circuit illustrated in FIG. 2A is described below with reference to FIG. 2B.

Figure 2B:
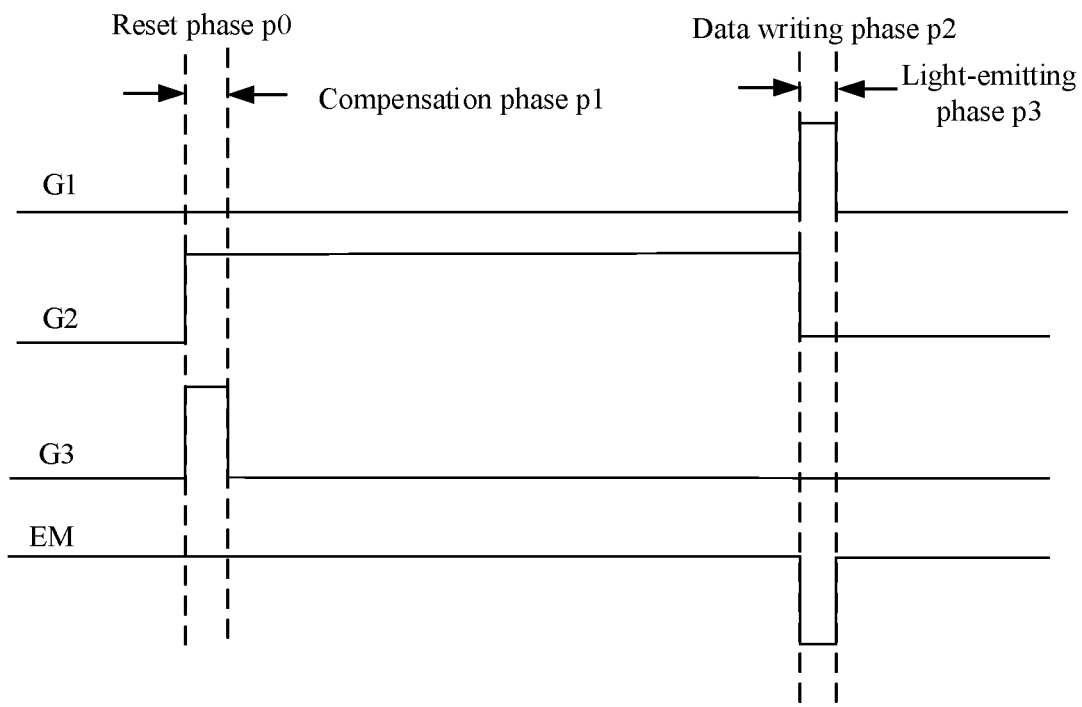
FIG. 2B is a timing diagram of the pixel circuit illustrated in FIG. 2A.

For example, as illustrated in FIG. 2B, G1 represents the first scan signal provided by the first scan line, G2 represents the second scan signal provided by the second scan line, G3 represents the third scan signal output by the third scan line, and EM represents the light-emitting control signal output by the control signal line. It should be noted that, in the embodiments of the present disclosure, the reference signs G1, G2, G3, EM, Vref, VDD, Vini, and VSS not only denote corresponding signal lines or signal terminals, but also denote the signals transmitted on the signal lines and the signal terminals.

For example, the working process of one pixel circuit in one display frame may include: a reset phase p0, a compensation phase p1, a data writing phase p2, and a light-emitting phase p3.

In the reset phase p0, the first scan signal G1 is at a low level, the second scan signal G2, the third scan signal G3, and the light-emitting control signal EM are at a high level, and therefore, the third transistor T3 is turned off under the control of the low level of the first scan signal G1, the first transistor T1 is turned on under the control of the high level of the third scan signal G3, the fourth transistor T4 is also turned on under the control of the high level of the second scan signal G2, and the fifth transistor T5 is turned on under the control of the high level of the light-emitting control signal EM. Because the third transistor T3 is turned off, the first transistor T1 is turned on, and the fourth transistor T4 is also turned on, in this phase, applying the reference voltage Vref to the fourth transistor T4 and applying the initial voltage Vini to the first transistor T1 can realize the reset of the pixel circuit, that is, the reference voltage Vref is written to the first node G, and the initial voltage Vini is written to the second node S, so that the pixel circuit is not affected by the previous frame when performing the compensation in the next phase.

In some embodiments of the present disclosure, Vref>Vini+Vth, where Vth is the threshold voltage of the second transistor T2.

For example, in some embodiments, the first transistor T1 may be a double-gate transistor, so that the current of the first transistor T1 can be relatively large, and furthermore the second node S can quickly reach the initial voltage Vini, thereby improving the reset efficiency.

In the compensation phase p1, the first scan signal G1 is at a low level, the second scan signal G2 is at a high level, the third scan signal G3 is at a low level, and the light-emitting control signal EM is at a high level, and therefore, the third transistor T3 is turned off under the control of the low level of the first scan signal G1, the first transistor T1 is turned off under the control of the low level of the third scan signal G3, the fourth transistor T4 is turned on under the control of the high level of the second scan signal G2, and the fifth transistor T5 is turned on under the control of the high level of the light-emitting control signal EM. Because the third transistor T3 and the first transistor T1 are turned off, and the fourth transistor T4 and the fifth transistor T5 are turned on, in this phase, the voltage of the first node G is maintained at Vref, and the second node S starts to be charged until Vs=Vref−Vth, and Vs is the voltage of the second node S.

In the data writing phase p2, the first scan signal G1 is at a high level, the second scan signal G2 is at a low level, the third scan signal G3 is at a low level, and the light-emitting control signal EM is at a low level, and therefore, the third transistor T3 is turned on under the control of the high level of the first scan signal G1, the first transistor T1 is turned off under the control of the low level of the third scan signal G3, the fourth transistor T4 is turned off under the control of the low level of the second scan signal G2, and the fifth transistor T5 is turned off under the control of the low level of the light-emitting control signal EM. Because the third transistor T3 is turned on, and the first transistor T1, the fourth transistor T4, and the fifth transistor T5 are turned off, in this phase, the data signal from the data signal line Vd is written into the first node G, and the voltage of the second node S is coupled to Vs. The voltage VG of the first node G and the voltage Vs of the second node S satisfy the following relationship:

$$VG=Vdata$$

$$Vs=a(Vdata-Vref)+Vref-Vth$$

$$a=Cst/(Cst+Coled)$$

$$VGS=VG-Vs=(1-a)(Vdata-Vref)+Vth$$

Cst represents the capacitance of the capacitor Cst, Coled represents the capacitance generated by the light-emitting element 20 itself, and VGS represents the voltage difference between the first node G and the second node S.

In the light-emitting phase p3, the first scan signal G1 is at a low level, the second scan signal G2 is at a low level, the third scan signal G3 is at a low level, and the light-emitting control signal EM is at a high level, and therefore, the third transistor T3 is turned off under the control of the low level of the first scan signal G1, the first transistor T1 is turned off under the control of the low level of the third scan signal G3, the fourth transistor T4 is turned off under the control of the low level of the second scan signal G2, and the fifth transistor T5 is turned on under the control of the high level of the light-emitting control signal EM. Because the third transistor T3, the first transistor T1, and the fourth transistor T4 are turned off, and the fifth transistor T5 is turned on, in this phase, the voltage difference VGS between the first node G and the second node S is maintained as VGS=VG−Vs=(1−a)(Vdata−Vref)+Vth.

The calculation formula for calculating the light-emitting current is as follows:

$$Ids=1/2*u*Cox*(W/L)*(vgs-Vth)^2$$

$$Ids=1/2*u*Cox*(W/L)[(1-a)^2(Vdata-Vref)^2]$$

It can be known from the above calculation formula of the light-emitting current that the light-emitting current flowing through the light-emitting element 20 has nothing to do with the threshold voltage Vth of the second transistor T2, thus achieving the compensation.

Figures 2C, 2D:
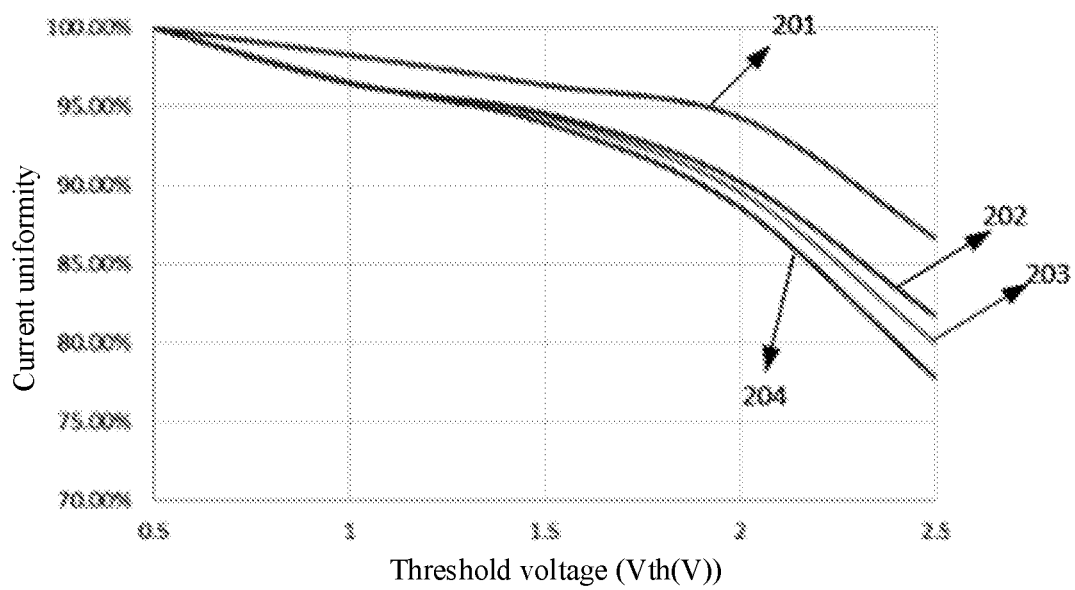
FIG. 2C to FIG. 2E are schematic diagrams illustrating an effect of current compensation implemented by a pixel circuit provided by an embodiment of the present disclosure.
Figure 2E:
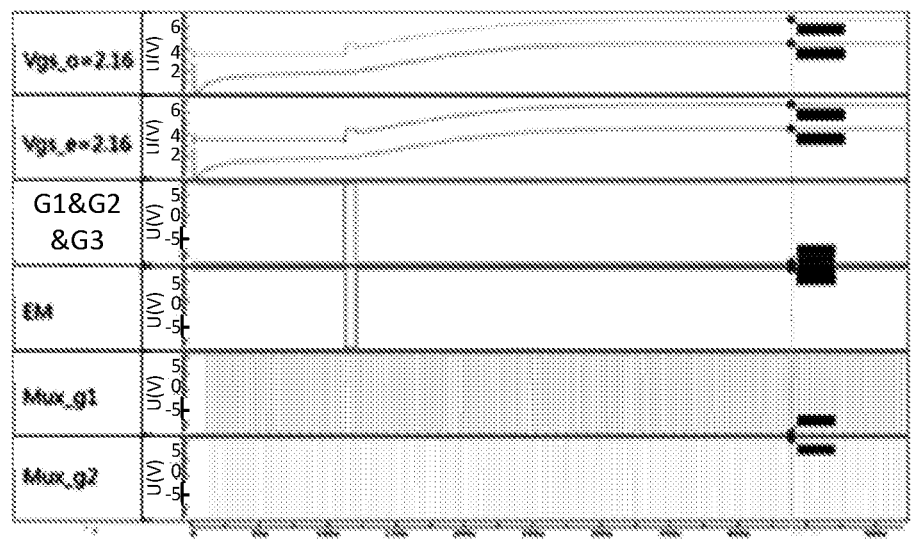

FIG. 2C to FIG. 2E are schematic diagrams illustrating an effect of current compensation implemented by a pixel circuit provided by an embodiment of the present disclosure.

In the table illustrated in FIG. 2C, T represents the time length of the compensation phase p1. For example, in the case where the compensation time length of a pixel circuit is 110 μs and the threshold voltage of the driving circuit is 0.5V, the currents I_oled flowing through the light-emitting element are 96.43 nA and 83.94 nA, respectively. Using the pixel circuit provided by the present disclosure, in the case where the compensation time length is 130 μs and the threshold voltage of the driving circuit is 0.5V, the currents I_oled flowing through two different light-emitting elements are 96.43 nA and 70.58 nA.

The above test is repeated under the condition that the threshold voltage of the driving circuit is 1V, 1.5V, 2V, and 2.5V, respectively, and the uniformity of the light-emitting element is calculated under the conditions of 0.5V, 1V, 1.5V, 2V, and 2.5V. For example, in the case where the compensation time length of a pixel circuit is 110 μs, the uniformity of the current I_oled of the light-emitting element is 86.64%. For example, in the case where the compensation time length of the pixel circuit of the present disclosure is 130 μs, the uniformity of the current I_oled of the light-emitting element is 80%. For example, in the case where the compensation time length of the pixel circuit of the present disclosure is 150 μs, the uniformity of the current I_oled of the light-emitting element is 81.7%.

Therefore, by comparing a scheme of the common pixel circuit and the pixel circuit provided by the present disclosure through the table in FIG. 2C, it can be seen that after the time length of the compensation phase p1 is appropriately extended, the compensation capability of the pixel circuit provided by the present disclosure can at least reach or even exceed the capacity of the usual technical solutions. In addition, the pixel circuit provided by the present disclosure can reduce the structural complexity of the display substrate, is easy to design and manufacture, and has a low cost.

FIG. 2D is a diagram illustrating curves of a relationship between the current uniformity and the threshold voltage of the driving circuit in the table illustrated in FIG. 2C. In FIG. 2D, the curve 210 represents the relationship between the current uniformity of a pixel circuit and the driving circuit in the case where the compensation time length is 110 μs, the curve 220 represents the relationship between the current uniformity of the pixel circuit of the present disclosure and the driving circuit in the case where the compensation time length is 150 μs, the curve 230 represents the relationship between the current uniformity of the pixel circuit of the present disclosure and the driving circuit in the case where the compensation time length is 130 μs, and the curve 240 represents the relationship between the current uniformity of the pixel circuit of the present disclosure and the driving circuit in the case where the compensation time length is 110 μs.

In FIG. 2E, Vgs_o represents the current flowing through the sub-pixels in the even-numbered columns, and Vgs_e represents the current flowing through the sub-pixels in the odd-numbered columns. Mux_g1 represents the multiplexing circuit g1, and Mux_g2 represents the multiplexing circuit g2. As illustrated in FIG. 2E, under the same gray scale, after flowing through the multiplexing circuit, the current Vgs_o flowing through the sub-pixels in the even-numbered columns is equal to the current Vgs_e flowing through the sub-pixels in the odd-numbered columns. That is to say, the pixel circuit provided by the present disclosure can make the currents respectively flowing through two adjacent columns of sub-pixels have no difference, so that the pixel circuit provided by the present disclosure can be compatible with the multiplexing design of the data driver.

Figure 3:
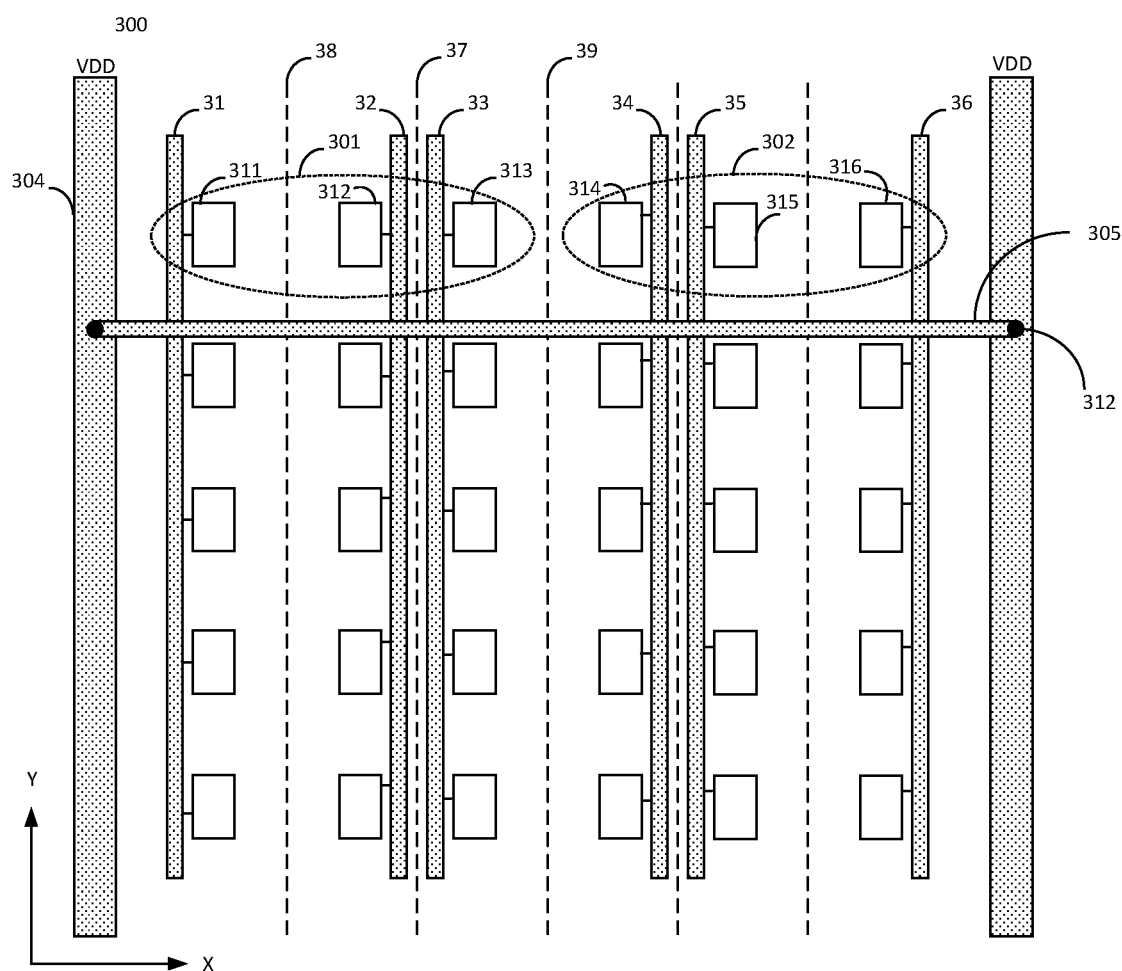
FIG. 3 illustrates a schematic diagram of a display substrate 300 provided by at least one embodiment of the present disclosure.

FIG. 3 illustrates a schematic diagram of a display substrate 300 provided by at least one embodiment of the present disclosure.

As illustrated in FIG. 3, the display substrate 300 may include a pixel array including a plurality of rows and a plurality of columns formed by a plurality of sub-pixels. The plurality of sub-pixels are divided into a plurality of pixel units.

For example, two pixel units 301 and 302 in the first row are schematically illustrated in FIG. 3. Each pixel unit includes three adjacent sub-pixels located in the same row, and each pixel unit includes a first sub-pixel, a second sub-pixel, and a third sub-pixel arranged in sequence along the first direction X. For example, the pixel unit 301 includes a first sub-pixel 311, a second sub-pixel 312, and a third sub-pixel 313. For another example, the pixel unit 302 includes a first sub-pixel 314, a second sub-pixel 315, and a third sub-pixel 316. In some embodiments of the present disclosure, for example, the three adjacent sub-pixels are a sub-pixel for emitting red light, a sub-pixel for emitting green light, and a sub-pixel for emitting blue light, respectively.

The data writing circuit in the pixel circuit of the first sub-pixel is connected to the first data line to receive the corresponding data signal, the data writing circuit in the pixel circuit of the second sub-pixel is connected to the second data line to receive the corresponding data signal, and the data writing circuit in the pixel circuit of the third sub-pixel is connected to the third data line to receive the corresponding data signal. For example, the data writing circuit in the pixel circuit of the first sub-pixel 311 is connected to the first data line 31 to receive the data signal of the first data line 31; the data writing circuit in the pixel circuit of the second sub-pixel 312 is connected to the second data line 32 to receive the data signal of the second data line 32; and the data writing circuit in the pixel circuit of the third sub-pixel 313 is connected to the third data line 33 to receive the data signal of the third data line 33. For another example, the data writing circuit in the pixel circuit of the first sub-pixel 314 is connected to the first data line 34 to receive the data signal of the first data line 34; the data writing circuit in the pixel circuit of the second sub-pixel 315 is connected to the second data line 35 to receive the data signal of the second data line 35; and the data writing circuit in the pixel circuit of the third sub-pixel 316 is connected to the third data line 36 to receive the data signal of the third data line 36.

In some embodiments of the present disclosure, for example, the first data line provides the corresponding data signal Data_R for the sub-pixel emitting red light, the second data line provides the corresponding data signal Data_G for the sub-pixel emitting green light, and the third data line provides the corresponding data signal Data_B for the sub-pixel emitting blue light.

As illustrated in FIG. 3, for example, the first data line, the second data line, and the third data line are parallel to each other and extend along the second direction Y, and the second direction Y is perpendicular to the first direction X.

For example, as illustrated in FIG. 3, the first direction X is a direction parallel to the row direction of the pixel array, and the second direction Y is a direction parallel to the column direction of the pixel array.

In some embodiments of the present disclosure, the orthographic projections of at least part of the pixel circuits of every two adjacent sub-pixels in the same row of the plurality of sub-pixels on the base substrate are mirror-symmetrical.

For example, an orthographic projection of the pixel circuit of the first sub-pixel on the base substrate and an orthographic projection of the pixel circuit of the second sub-pixel on the base substrate are mirror-symmetrical with respect to a center line between the first data line and the second data line, and the orthographic projection of the pixel circuit of the second sub-pixel on the base substrate and an orthographic projection of the pixel circuit of the third sub-pixel on the base substrate are mirror-symmetrical with respect to a center line between the second data line and the third data line.

For example, in the display substrate 300 illustrated in FIG. 3, for the pixel unit 301, the orthographic projection 311 of the pixel circuit of the first sub-pixel 311 on the base substrate and the orthographic projection 312 of the pixel circuit of the second sub-pixel 312 on the base substrate are mirror-symmetrical with respect to the center line 38 between the first data line 31 and the second data line 32. The orthographic projection 312 of the pixel circuit of the second sub-pixel 312 on the base substrate and the orthographic projection 313 of the pixel circuit of the third sub-pixel 313 on the base substrate are mirror-symmetrical with respect to the center line 37 between the second data line 32 and the third data line 33. The pixel unit 302 is similar to the above-mentioned pixel unit 301, and similar portions will not be repeated here.

It should be noted that, in the embodiments of the present disclosure, reference numerals 311, 312, 313, 314, 315, and 316 represent sub-pixels, and also represent the orthographic projections of the pixel circuits of the sub-pixels on the base substrate. It should be noted that the rectangular boxes marked with 311, 312, 313, 314, 315, and 316 in the figure only schematically represent the positions of the corresponding pixel circuits, and do not represent the actual shapes or actual projection shapes of the pixel circuits.

In some embodiments of the present disclosure, the first data line is located on a side of the first sub-pixel away from the second sub-pixel, and the second data line and the third data line are located between the second sub-pixel and the third sub-pixel.

For example, as illustrated in FIG. 3, for the pixel unit 301, the first data line 31 is located on the side of the first sub-pixel 311 away from the second sub-pixel 312, and the second data line 32 and the third data line 33 are located between the second sub-pixel 312 and the third sub-pixel 313.

In other embodiments of the present disclosure, the first data line and the second data line are located between the first sub-pixel and the second sub-pixel, and the third data line is located on a side of the third sub-pixel away from the second sub-pixel.

For example, as illustrated in FIG. 3, for the pixel unit 302, the first data line 34 and the second data line 35 are located between the first sub-pixel 314 and the second sub-pixel 315, and the third data line 36 is located on the side of the third sub-pixel 316 away from the second sub-pixel 315.

In some embodiments of the present disclosure, for two pixel units that are adjacent and in the same row, distribution positions of multi-line patterns formed by the first data line, the second data line, and the third data line in the two pixel units are mirror-symmetrical.

For example, as illustrated in FIG. 3, for adjacent pixel units 301 and 302 in the same row, the multi-line pattern composed of the first data line 31, the second data line 32, and the third data line 33 and the multi-line pattern composed of the first data line 34, the second data line 35, and the third data line 36 are mirror-symmetrical with respect to the center line 39.

In some embodiments of the present disclosure, the first voltage line includes a first voltage main line and a first voltage bridging line, and the first voltage main line extends along the second direction Y and is parallel to the first data line, the second data line, and the third data line. The first voltage bridging line extends along the first direction X, the first voltage bridging line is connected to the first voltage main line through a first hole, and the first voltage bridging line is configured to provide the first voltage to two rows of the sub-pixels respectively located on two sides of the first voltage bridging line and adjacent to the first voltage bridging line.

For example, as illustrated in FIG. 3, the first voltage line VDD may include a first voltage main line 304 and a first voltage bridging line 305. The first voltage main line 304 extends along the second direction Y (e.g., the column direction of the pixel array), and is parallel to the first data line, the second data line, and the third data line. The first voltage bridging line 305 extends along the first direction X (e.g., the row direction of the pixel array), the first voltage bridging line 305 is connected to the first voltage main line 304 through the first hole 312, and the first voltage bridging line 305 is configured to provide the first voltage to the two rows of the sub-pixels respectively located on two sides of the first voltage bridging line 305 and adjacent to the first voltage bridging line 305.

For example, the sub-pixels 311 to 316 are a plurality of sub-pixels in the first row in the pixel array, and the first voltage bridging line 305 is configured to provide the first voltage to the plurality of sub-pixels 311 to 316 in the first row and the plurality of sub-pixels in the second row.

The first voltage bridging line 305 provides the first voltage to two adjacent rows of sub-pixels, that is, two adjacent rows of sub-pixels share one first voltage bridging line 305, which can simplify the display substrate and save the space occupied by the wiring.

Figure 4:
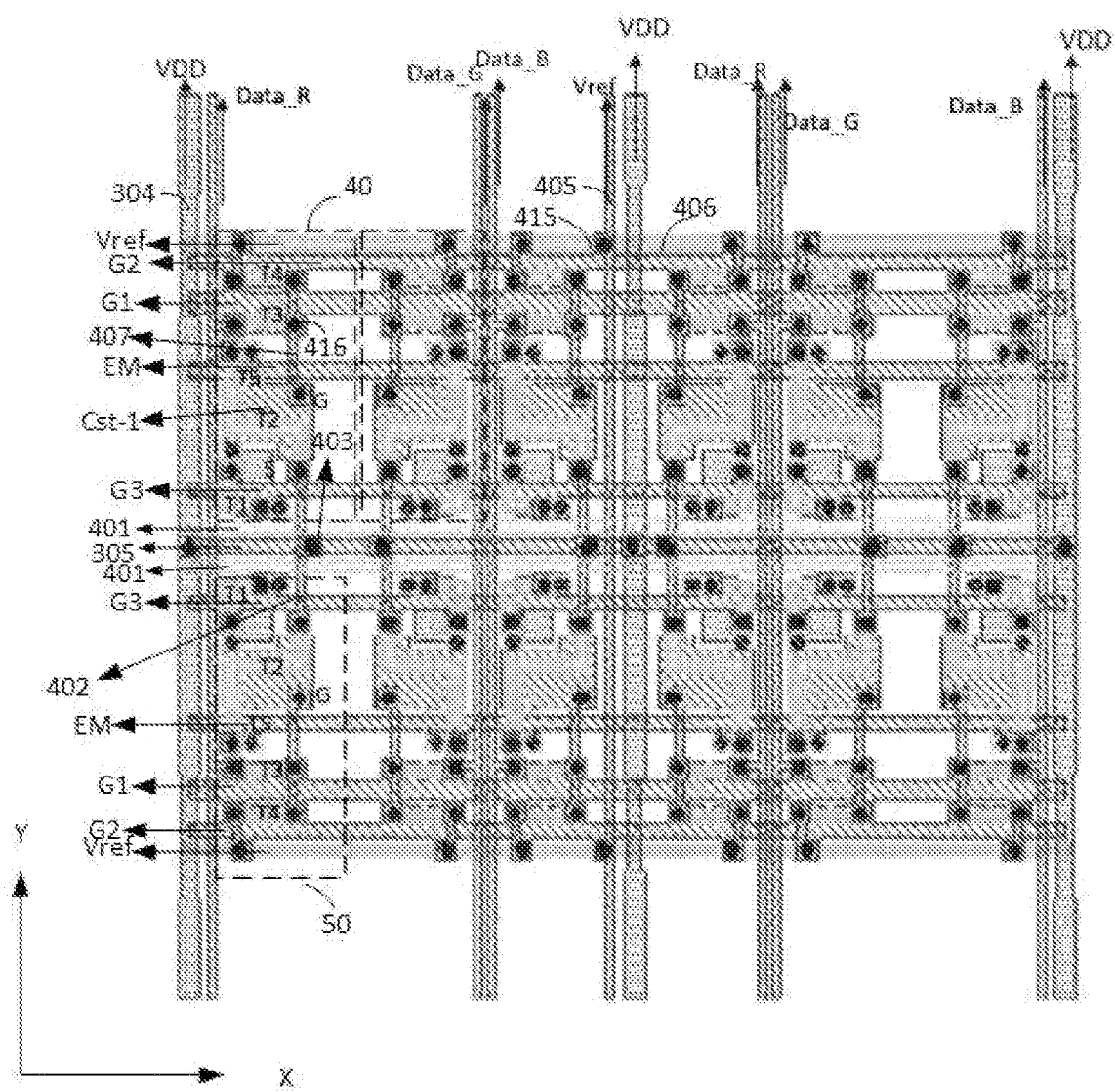
FIG. 4 is a schematic layout diagram of a pixel circuit provided by some embodiments of the present disclosure.
Figure 5A:
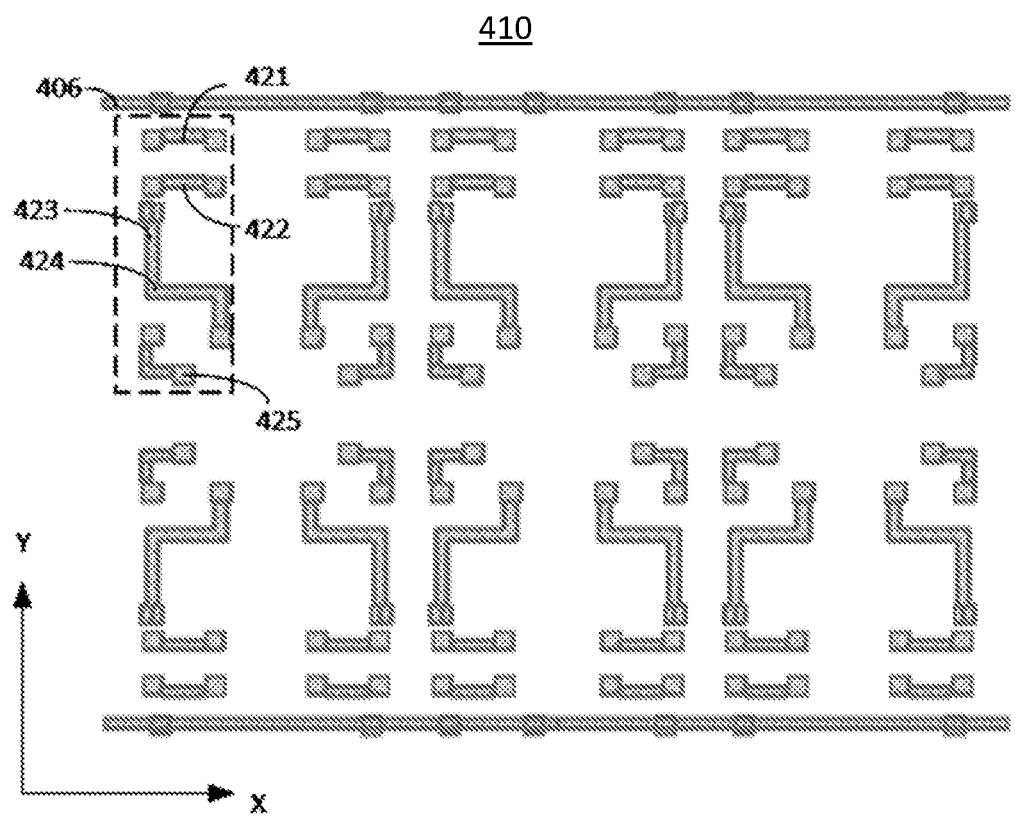
FIG. 5A to FIG. 5Q are schematic diagrams of various layer structures of a pixel circuit provided by some embodiments of the present disclosure.
Figure 5B:
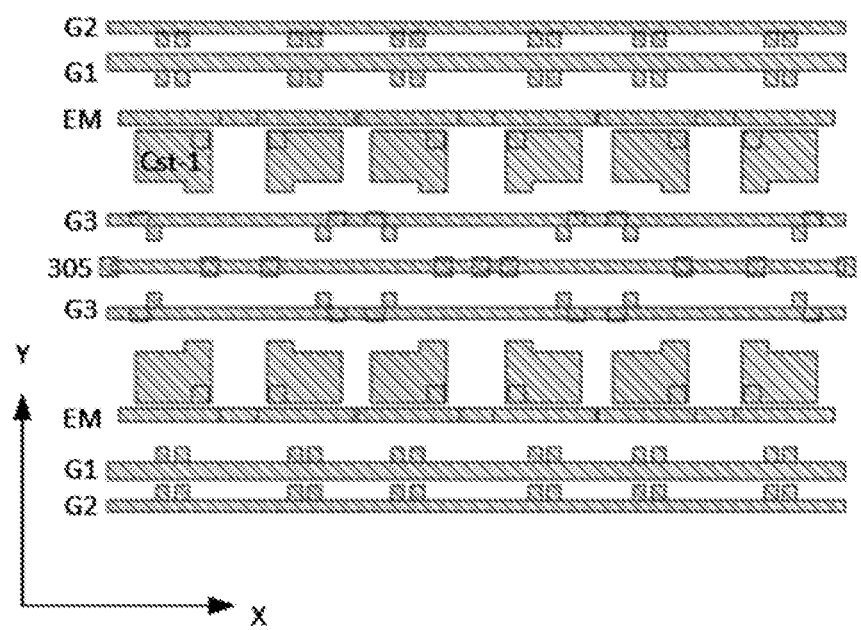
Figure 5C:
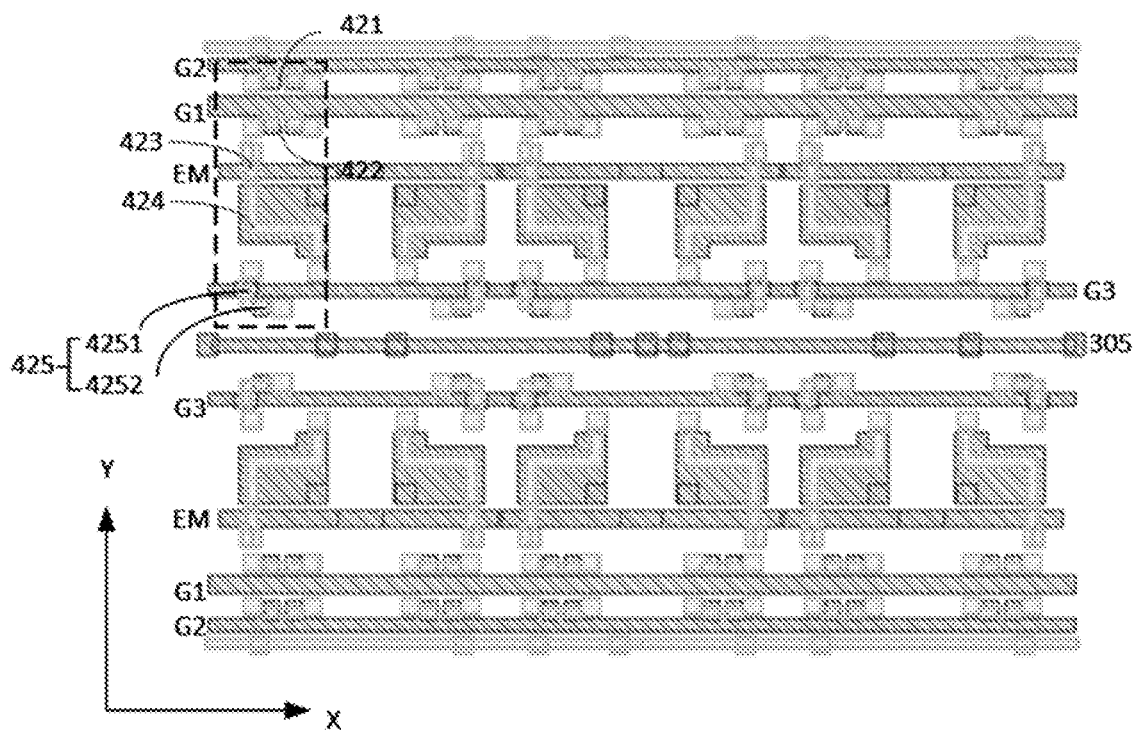
Figure 5D:
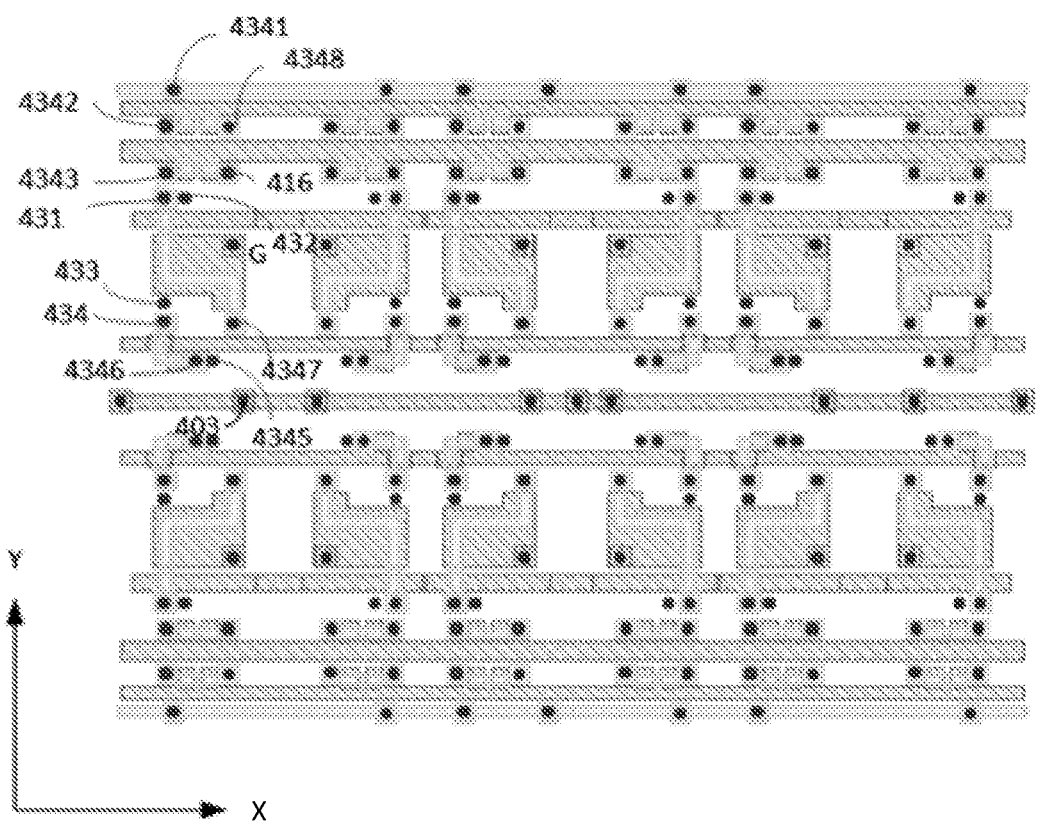
Figure 5E:
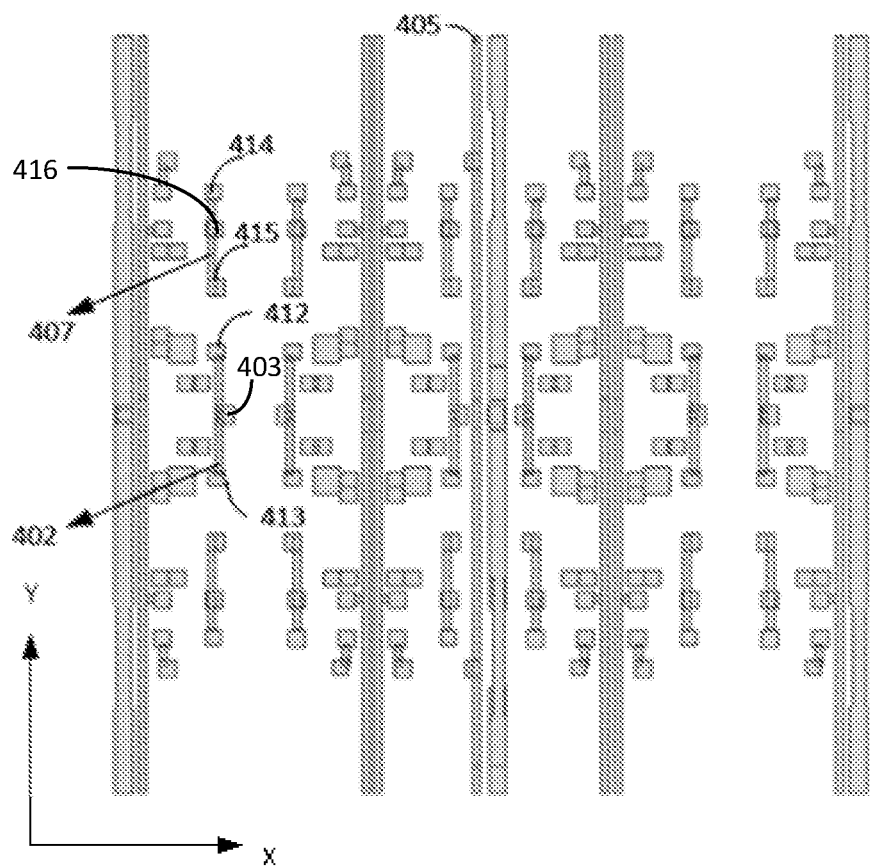
Figure 5F:
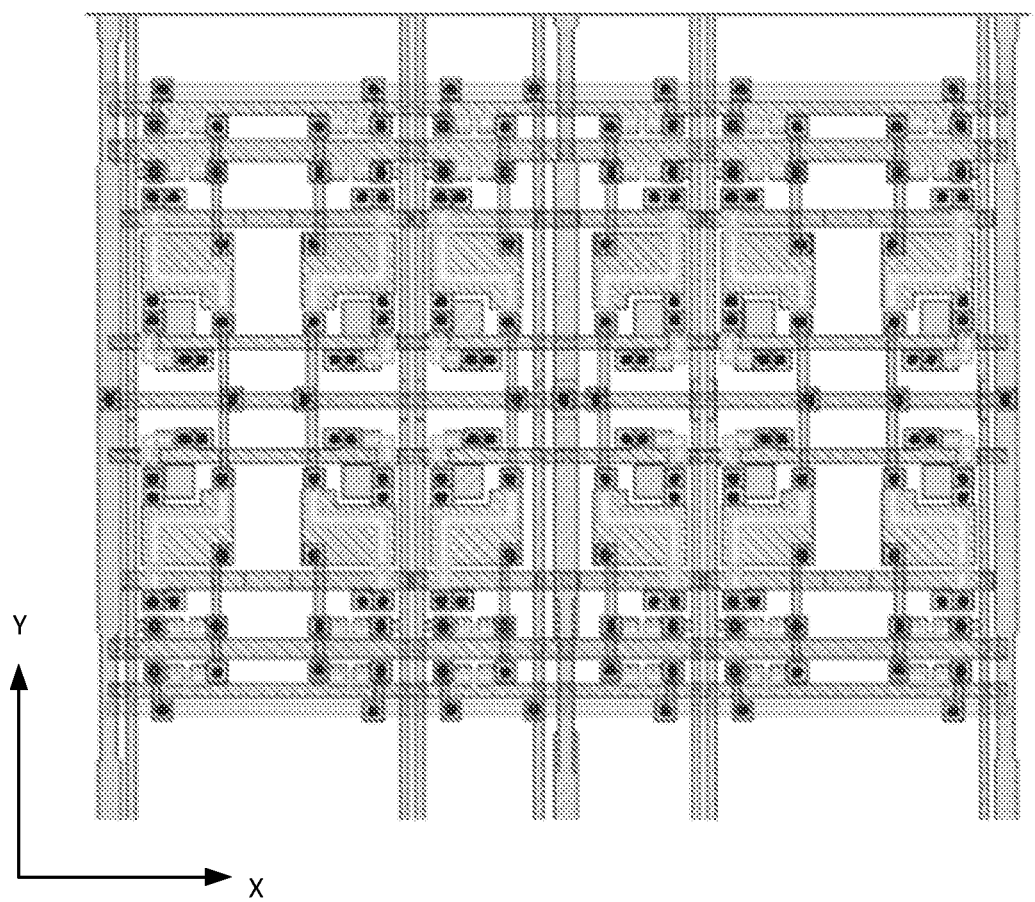
Figure 5G:
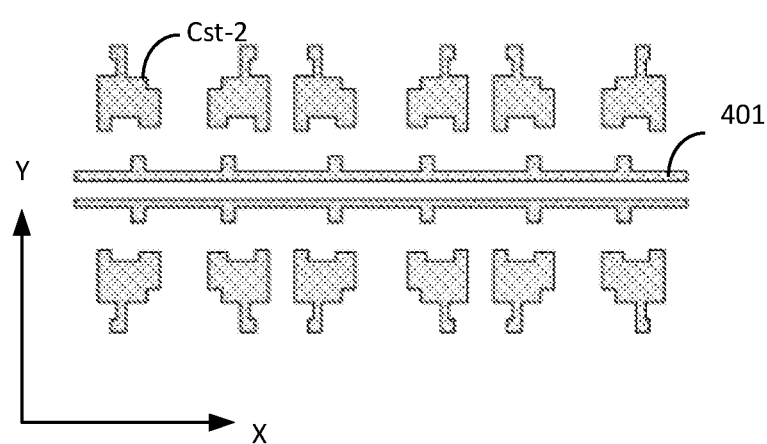
Figure 5H:
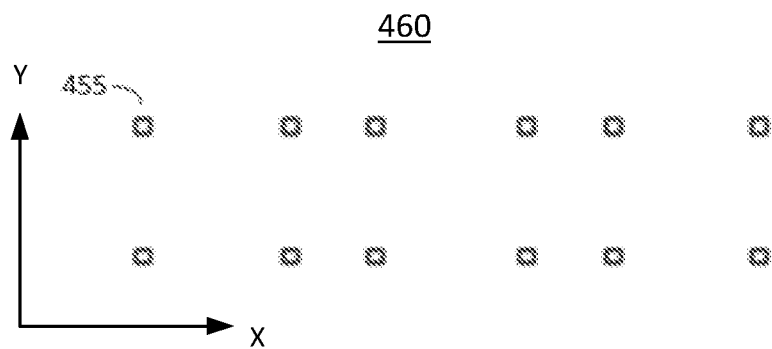
Figure 5I:
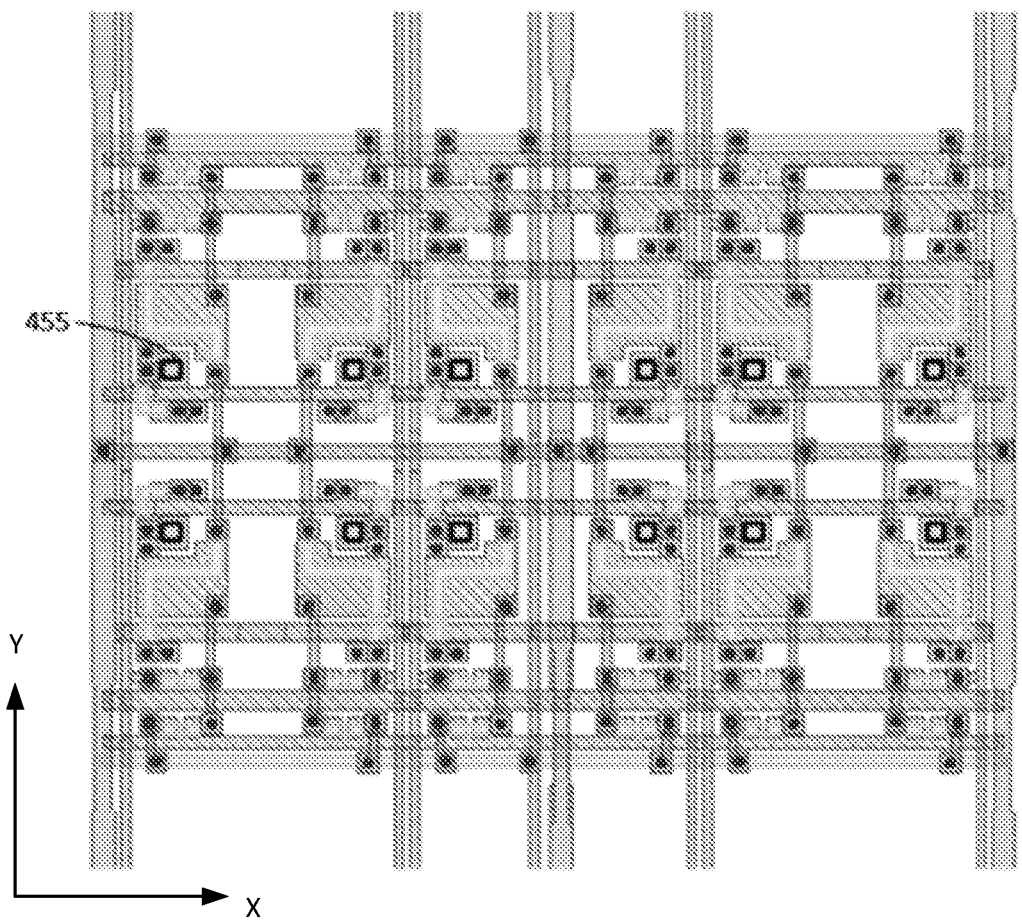
Figure 5J:
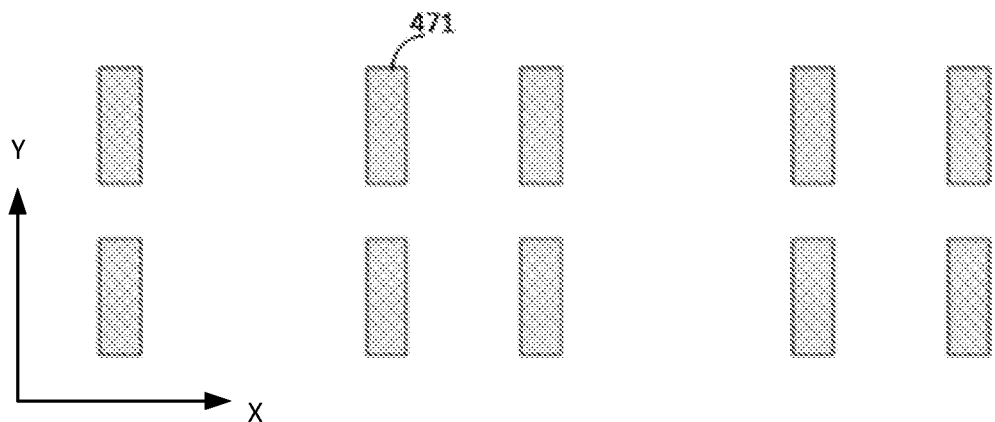
Figure 5K:
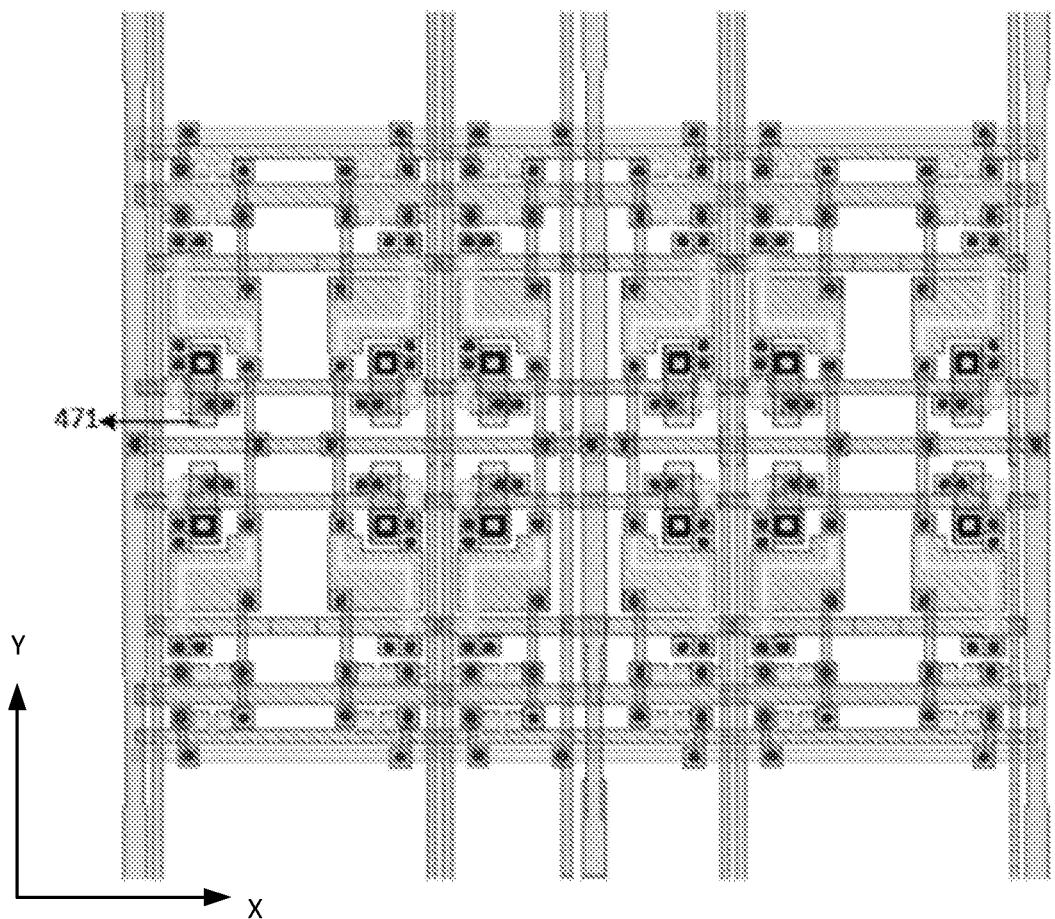
Figure 5L:
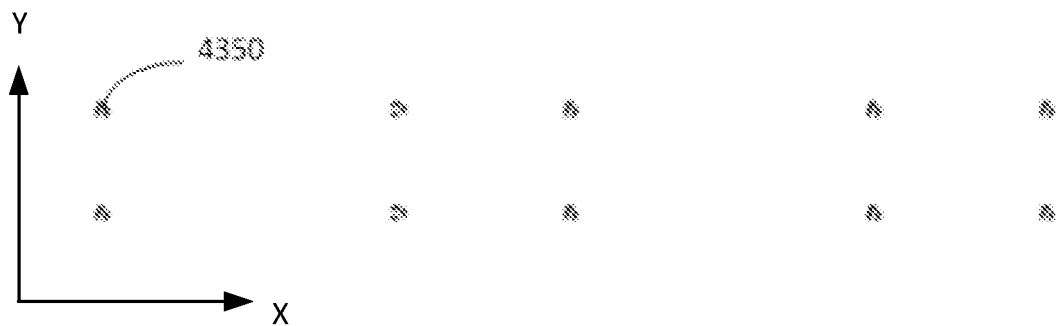
Figure 5M:
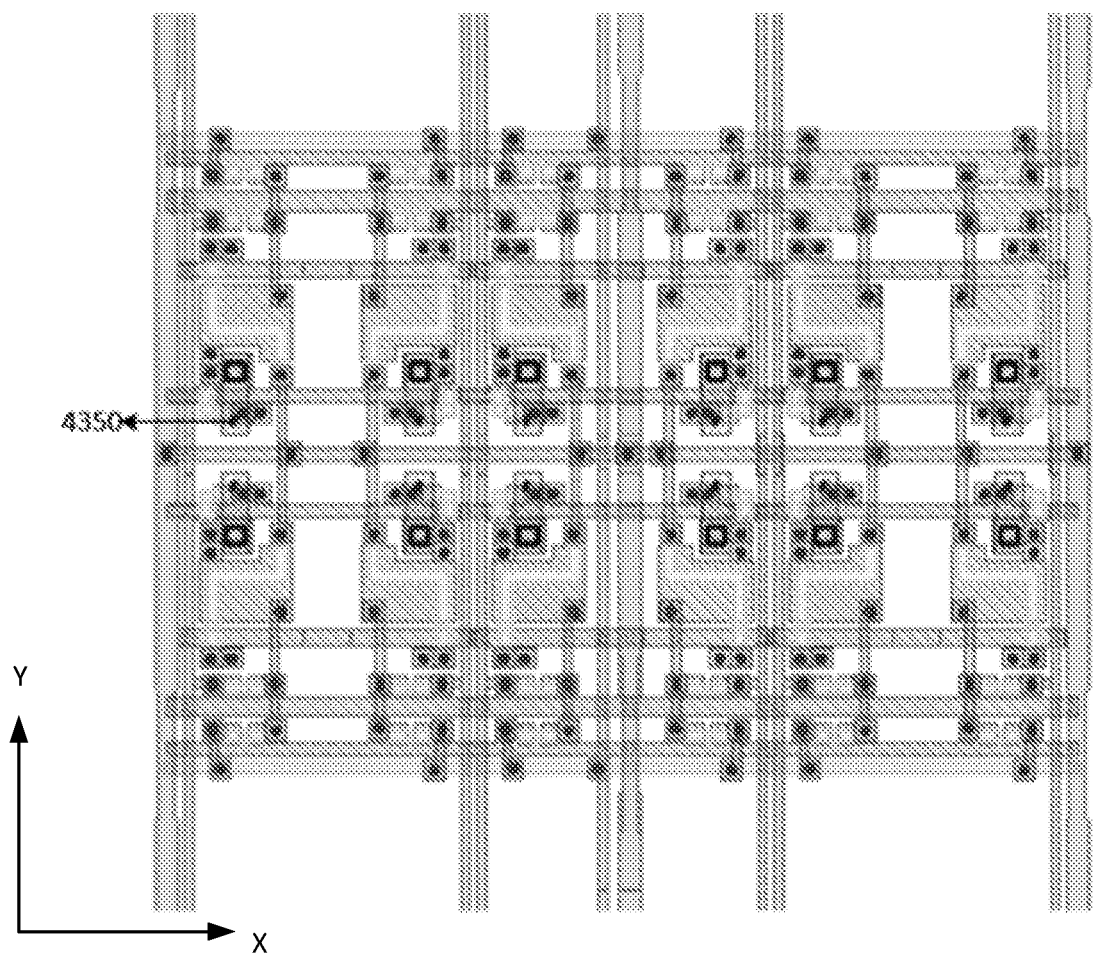
Figure 5N:
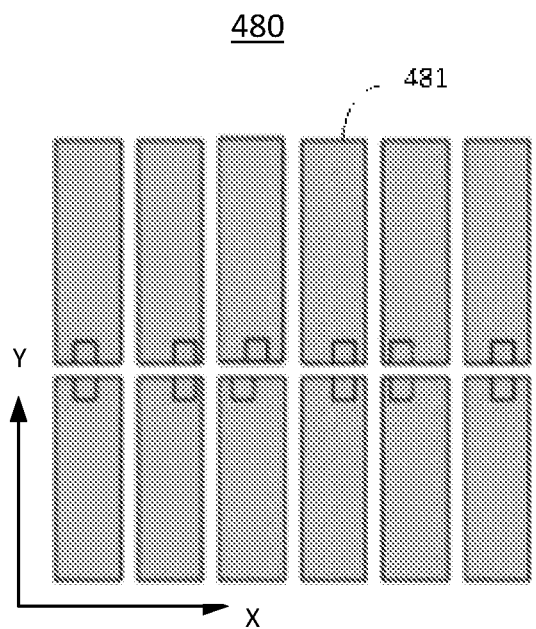
Figure 5O:
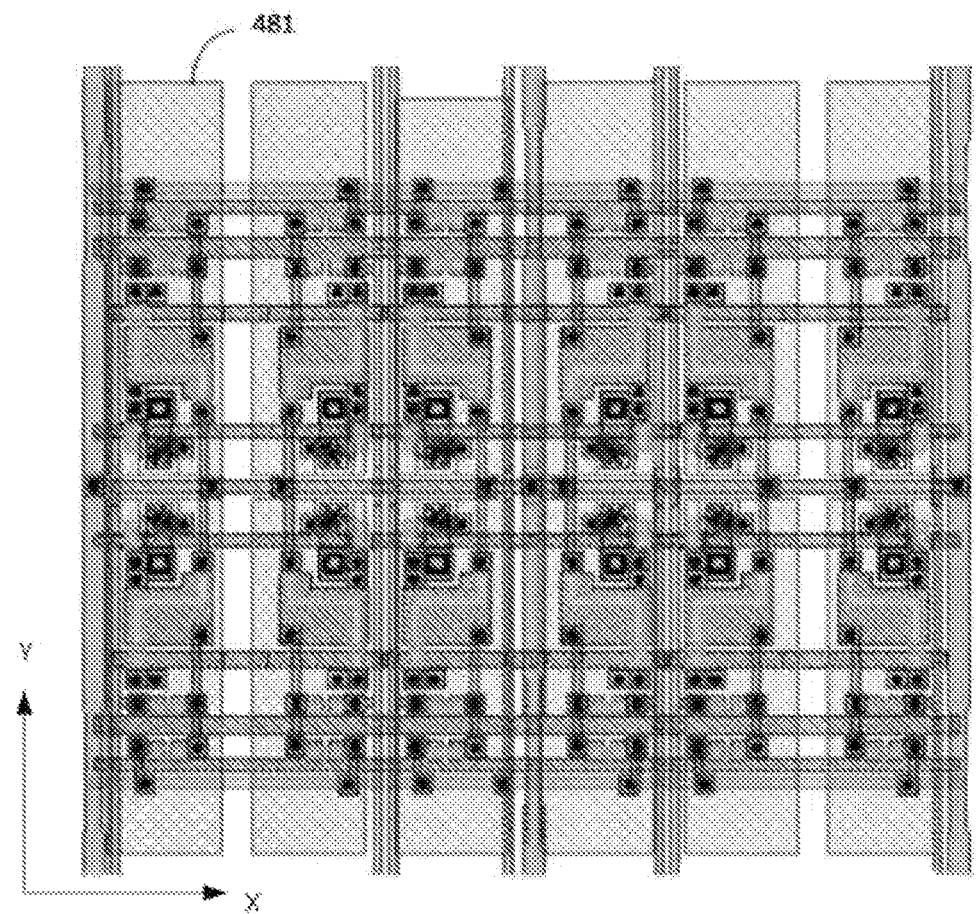
Figure 5P:
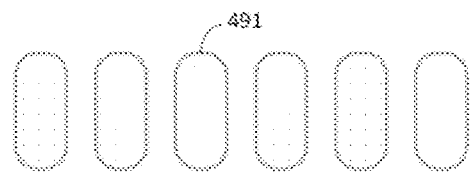
Figure 5P:
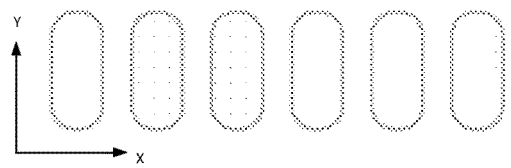
Figure 5Q:
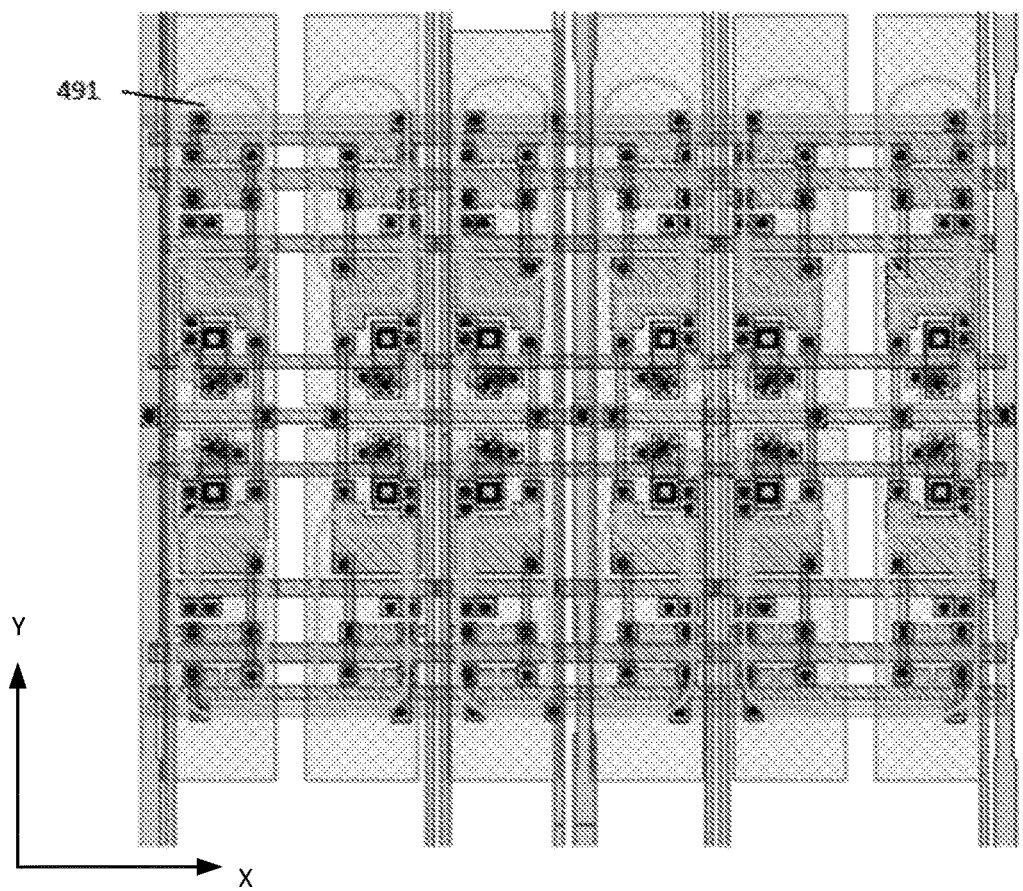

FIG. 4 is a schematic layout diagram of a pixel circuit provided by some embodiments of the present disclosure, and FIG. 5A to FIG. 5Q are schematic diagrams of various layer structures of a pixel circuit provided by some embodiments of the present disclosure. For example, as illustrated in FIG. 4, one dotted-line box represents one pixel circuit illustrated in FIG. 2A.

For example, as illustrated in FIG. 4, the display substrate may at least include a pixel circuit 40 and a pixel circuit 50, and the two pixel circuits belong to different sub-pixels. The structure of the pixel circuit in the present disclosure is described below by taking the pixel circuit 40 as an example.

The display substrate may include an active semiconductor layer, a first conductive layer, a first source-drain metal layer, a second conductive layer, a second source-drain metal layer, and an anode layer. The active semiconductor layer 410 is illustrated in FIG. 5A, the first conductive layer 420 is illustrated in FIG. 5B, the first source-drain metal layer 490 is illustrated in FIG. 5E, the second conductive layer 440 is illustrated in FIG. 5F, the second source-drain metal layer 450 is illustrated in FIG. 5I, and the anode layer 480 is illustrated in FIG. 5L. In the direction perpendicular to the base substrate 101, the active semiconductor layer 410 is located between the base substrate 101 and the first conductive layer 420, the first conductive layer 420 is located between the active semiconductor layer 410 and the first source-drain metal layer 490, the first source-drain metal layer 490 is located between the first conductive layer 420 and the second conductive layer 440, the second conductive layer 440 is located between the first source-drain metal layer 490 and the second source-drain metal layer 450, and the second source-drain metal layer 450 is located between the second conductive layer 440 and the anode layer 480.

In some embodiments of the present disclosure, the second control circuit includes a first end and a second end, the first end of the second control circuit is connected to the first electrode of the light-emitting element, and the second end of the second control circuit is connected to an initial signal line to receive the initial voltage. The initial signal line is parallel to the first voltage bridging line, and is between an orthographic projection of the first voltage bridging line on the base substrate and an orthographic projection of the second control circuit on the base substrate.

It should be understood that "orthographic projection" herein refers to a projection in the direction perpendicular to the base substrate.

For example, as illustrated in FIG. 2A, the second control circuit may be a first transistor T1, the first transistor T1 includes a first end and a second end, and the first end of the first transistor T1 is connected to the first electrode of the light-emitting element 20, and the second end of the first transistor T1 is connected to the initial signal line to receive the initial voltage. As illustrated in FIG. 4, the second end of the first transistor T1 is connected to the initial signal line 401, the initial signal line 401 is parallel to the first voltage bridging line 305 and is located between the orthographic projection of the first voltage bridging line 305 on the base substrate and the orthographic projection of the first transistor T1 on the base substrate.

For example, the first transistor T1 includes a gate electrode. As illustrated in FIG. 2A, the gate electrode of the first transistor T1 is connected to the third scan line G3 to receive the third scan signal. As illustrated in FIG. 4 and FIG. 5C, the third scan line G3 is parallel to the first voltage bridging line 305 and is located on the side of the initial signal line 401 away from the first voltage bridging line 305. The first transistor T1 includes an active layer, and the orthographic projection of at least portion of the active layer of the first transistor T1 on the base substrate 101 is located between the orthographic projection of the third scan line G3 on the base substrate and the orthographic projection of the initial signal line 401 on the base substrate.

For example, as illustrated in FIG. 5C, the first transistor T1 includes a first channel 4251 and a second channel 4252, the orthographic projection of the first channel 4251 on the base substrate is perpendicular to the first voltage bridging line 305, the orthographic projection of the second channel 4252 on the base substrate is parallel to the first voltage bridging line 305, that is, the first channel 4251 and the second channel 4252 form an L-shaped channel region. As illustrated in FIG. 4, the orthographic projection of the second channel 4252 on the base substrate is located between the orthographic projection of the third scan line G3 on the base substrate and the orthographic projection of the initial signal line 401 on the base substrate.

For example, as illustrated in FIG. 3, FIG. 4, FIG. 5D, and FIG. 5E, the first voltage line VDD further includes a plurality of first voltage transfer portions 402. Each first voltage transfer portion 402 is configured to provide the first voltage to two sub-pixels (for example, the pixel circuit 40 and the pixel circuit 50) that are adjacent in the same column, on the different sides of the first voltage bridging line 305, and adjacent to the first voltage bridging line 305.

For example, the first voltage transfer portion 402 extends along the second direction Y and is connected to the first voltage bridging line 305 through the second hole 403, the first voltage transfer portion 402 includes a first end 412 and a second end 413, the first end 412 of the first voltage transfer portion 402 and the second end 413 of the first voltage transfer portion 402 are located on different sides of the first voltage bridging line 305. The first end 412 of the first voltage transfer portion 402 is connected to the pixel circuit 40 of the sub-pixel located on a side of the first voltage bridging line 305, and the second end 413 of the first voltage transfer portion 402 is connected to the pixel circuit 50 of the sub-pixel on the other side of the first voltage bridging line 305. The complexity of the pixel circuit can be reduced by supplying, through the first voltage transfer portion 402, the first voltage to two adjacent sub-pixels located in the same column.

In some embodiments of the present disclosure, as illustrated in FIG. 4, the orthographic projection of the first voltage transfer portion 402 on the base substrate overlaps with the orthographic projection of the initial signal line 401 on the base substrate and the orthographic projection of the third scan line G3 on the base substrate.

For example, the first voltage transfer portion 402 sequentially crosses the third scan line G3 of the pixel circuit 40, the initial signal line 401 of the pixel circuit 40, the third scan line G3 of the pixel circuit 50, and the initial signal line 401 of the pixel circuit 50.

In some embodiments of the present disclosure, as illustrated in FIG. 2A, the light-emitting control circuit may include a fifth transistor, and the control end of the light-emitting control circuit may be the gate electrode of the fifth transistor T5.

For example, as illustrated in FIG. 4 and FIG. 2A, the gate electrode of the fifth transistor T5 is connected to the control signal line EM to receive the light-emitting control signal. The control signal line EM is parallel to the first voltage bridging line 305, and the control signal line EM is located on the side of the third scan line G3 away from the first voltage bridging line 305.

In some embodiments of the present disclosure, the control signal line EM and the third scan line G3 are located on different sides of the orthographic projection of the driving circuit on the base substrate.

For example, as illustrated in FIG. 2A, the driving circuit includes a second transistor T2. As illustrated in FIG. 4, the control signal line EM and the third scan line G3 are located on different sides of the orthographic projection of the second transistor T2 on the base substrate.

In some embodiments of the present disclosure, as illustrated in FIG. 4, FIG. 5B, and FIG. 5G, the storage circuit Cst includes a first capacitor plate Cst-1 and a second capacitor plate Cst-2, and an orthographic projection of the first capacitor plate Cst-1 on the base substrate is between the orthographic projection of the third scan line G3 on the base substrate and an orthographic projection of the control signal line EM on the base substrate. The orthographic projection of the first capacitor plate Cst-1 on the base substrate at least partially overlaps an orthographic projection of the second capacitor plate Cst-2 on the base substrate, the driving circuit comprises a second transistor T2, the second transistor T2 comprises a gate electrode, and the first capacitor plate Cst-1 serves as the gate electrode of the second transistor T2.

Herein, "at least partially overlap" may refer to partial overlapping or completely overlapping, and as long as there is an overlap portion, it can be considered to be at least partially overlap.

For example, the first capacitor plate Cst-1 and the second capacitor plate Cst-2 are stacked in the direction perpendicular to the base substrate, and the orthographic projection of the first capacitor plate Cst-1 on the base substrate at least partially overlaps the orthographic projection of the active layer of the second transistor T2 on the base substrate.

In some embodiments of the present disclosure, the first capacitor substrate Cst-1 may be disposed in the first conductive layer 420, and the second capacitor plate Cst-2 may be disposed in the second conductive layer 440.

In some embodiments of the present disclosure, the data writing circuit includes a control end. For example, the data writing circuit includes the third transistor T3, and the gate electrode of the third transistor T3 serves as the control end of the data writing circuit. As illustrated in FIG. 2A, the gate electrode of the third transistor T3 is connected to the first scan line G1 to receive the first scan signal. As illustrated in FIG. 4 and FIG. 5B, the first scan line G1 is parallel to the first voltage bridging line 305, and the first scan line G1 is located on a side of the control signal line EM away from the first voltage bridging line.

As illustrated in FIG. 4, in some embodiments of the present disclosure, the third transistor T3 includes an active layer, and the orthographic projection of the active layer of the third transistor T3 on the base substrate is located between the orthographic projection of the first scan line G1 on the base substrate and the orthographic projection of the control signal line EM on the base substrate.

In some embodiments of the present disclosure, the first control circuit includes a control end. For example, as illustrated in FIG. 4, the first control circuit is a fourth transistor T4, a gate electrode of the fourth transistor T4 serves as the control end of the first control circuit. The fourth transistor T4 is connected to the second scan line G2 to receive the second scan signal, the second scan line G2 is parallel to the first voltage bridging line 305, and the second scan line G2 is located on the side of the first scan line G1 away from the first voltage bridging line 305.

In some embodiments of the present disclosure, the fourth transistor T4 includes an active layer, and the orthographic projection of the active layer of the fourth transistor T4 on the base substrate is located between the orthographic projection of the first scan line G1 on the base substrate and the orthographic projection of the second scan line G2 on the base substrate.

In some embodiments of the present disclosure, the first control circuit further includes a first end and a second end, the first end of the first control circuit is connected to the reference voltage line to receive the reference voltage, and the second end of the first control circuit is connected to the control end of the driving circuit.

For example, as illustrated in FIG. 4 and FIG. 2A, the first end of the fourth transistor T4 is connected to the reference voltage line Vref to receive the reference voltage Vref, and the second end of the fourth transistor T4 is connected to the control end of the driving circuit (e.g., the gate electrode of the second transistor T2).

As illustrated in FIG. 4, FIG. 5A, and FIG. 5E, in some embodiments of the present disclosure, the reference voltage line Vref includes a reference voltage main line 405 and a reference voltage bridging line 406, the reference voltage main line 405 extends along the second direction Y and is parallel to the first voltage main line 304, the reference voltage bridging line 406 extends along the first direction X, and the reference voltage bridging line 406 is connected to the reference voltage main line 405 through the third hole 415. The reference voltage bridging line 406 is connected to the first control circuits of the plurality of sub-pixels in the same row, and is configured to provide the reference voltage Vref to the first control circuits of the plurality of sub-pixels in the same row.

Providing the reference voltage Vref to the plurality of sub-pixels in the same row through the reference voltage bridging line can simplify the circuit structure, reduce the amount of lines, and save the space occupied by the lines.

In some embodiments of the present disclosure, the plurality of sub-pixels located in the same row have a center line extending along the second direction Y, and the reference voltage main line overlaps with the center line.

For example, as illustrated in FIG. 3 and FIG. 4, each row in the pixel array may include 6 sub-pixels, and the 6 sub-pixels located in the same row have a center line 39 extending along the second direction Y, and the reference voltage main line Vref overlaps with the center line 39.

For example, the reference voltage bridging line is configured to provide the reference voltage to the first control circuits of six sub-pixels located in the same row.

In some embodiments of the present disclosure, the reference voltage bridging line 406 is located on a side of the second scan line G2 away from the first voltage bridging line 305.

In some embodiments of the present disclosure, the second end of the first control circuit and the first capacitor plate are connected to the second end of the data writing circuit through a first bridging portion, the first bridging portion extends along the second direction Y and is connected to the second end of the data writing circuit through a fourth hole, and an orthographic projection of the first bridging portion on the base substrate overlaps with the orthographic projection of the first scan line on the base substrate and the orthographic projection of the control signal line on the base substrate. The first bridging portion comprises a first end and a second end, and the first end of the first bridging portion is located on a side of the first scan line away from the control signal line and is connected to the second end of the first control circuit, and the second end of the first bridging portion is located on a side of the control signal line away from the first scan line and is connected to the first capacitor plate.

As illustrated in FIG. 4, FIG. 5D, and FIG. 5E, the first control circuit may be a fourth transistor T4, the second end 414 of the fourth transistor T4 and the first capacitor plate Cst are connected to the second end of the data writing circuit (i.e., the third transistor T3) through the first bridging portion 407. The first bridging portion 407 extends along the second direction Y and is connected to the second end of the third transistor T3 through the fourth hole 416. The orthographic projection of the first bridging portion 407 on the base substrate overlaps with the orthographic projection of the first scan line G1 on the base substrate and the orthographic projection of the control signal line EM on the base substrate.

In some embodiments of the present disclosure, for example, the orthographic projection of the first bridging portion 407 on the base substrate is perpendicular to the orthographic projection of the first scan line G1 on the base substrate and the orthographic projection of the control signal line EM on the base substrate.

As illustrated in FIG. 4, the first end of the first bridging portion 407 is located between the first scan line G1 and the second scan line G2, and the second end of the first bridging portion 407 is located on the side of the control signal line EM away from the first scan line G1 and is connected to a point G on the first capacitor plate.

In some embodiments of the present disclosure, the extension line of the first bridging portion 407 along the second direction Y overlaps the extension line of the first voltage transfer portion 402 along the second direction Y.

As illustrated in FIG. 4 and FIG. 5E, the extension line of the first bridging portion 407 along the second direction Y and the extension line of the first voltage transfer portion 402 along the second direction Y overlap with each other.

In some embodiments of the present disclosure, for example, as illustrated in FIG. 4, the orthographic projections of the pixel circuits 40 and 50 of two adjacent sub-pixels located in the same column on the base substrate are mirror-symmetrical with respect to a first symmetry line. In the case where the first voltage bridging line 305 is located between two adjacent sub-pixels in the same column, the first symmetry line overlaps with the first voltage bridging line. For example, for two sub-pixels corresponding to the pixel circuit 40 and the pixel circuit 50, the first voltage bridging line 305 is located between the two sub-pixels, in this case, the orthographic projection of the pixel circuit 40 on the base substrate and the orthographic projection of the pixel circuit 50 on the base substrate are mirror-symmetrical with respect to the first symmetry line, and the first symmetry line overlaps with the first voltage bridging line 503, that is, the orthographic projection of the pixel circuit 40 on the base substrate and the orthographic projection of the pixel circuit 50 on the base substrate are mirror-symmetrical with respect to the first voltage bridging line 503. In the case where the first voltage bridging line is not located between the two adjacent sub-pixels in the same column, the first symmetry line is a center line of first voltage bridging lines connected to the two adjacent sub-pixels in the same column, respectively. For example, for the two sub-pixels corresponding to the pixel circuit 50 and the pixel circuit (not illustrated in FIG. 4) below the pixel circuit 50, the first voltage bridging line 305 is not located between the two sub-pixels (there is no first voltage bridging line 305 between the two sub-pixels), a first voltage bridging line 305 above the pixel circuit 50 is connected to the pixel circuit 50, and a first voltage bridging line below the pixel circuit below the pixel circuit 50 is connected to the pixel circuit below the pixel circuit 50, in this case, the first symmetry line is the center line of the two first voltage bridging lines, and the orthographic projections of the two pixel circuits on the base substrate are mirror-symmetrical with respect to the first symmetry line.

For example, the distributions of the reference voltage bridging line 305, the initial signal line 401, the second scan line G2, the first scan line G1, the control signal line EM, and the third scan line G3 in the two adjacent sub-pixels located in the same column are mirror-symmetrical with respect to the first symmetry line.

In some embodiments of the present disclosure, as illustrated in FIG. 4, the plurality of sub-pixels are divided into a plurality of pixel units, and each pixel unit includes three adjacent sub-pixels located in the same row, and the display substrate is provided with a plurality of first voltage main lines distributed at intervals, and one pixel unit is disposed between every two adjacent first voltage main lines.

In some embodiments of the present disclosure, the light-emitting control circuit includes a fifth transistor. For example, as illustrated in FIG. 4, FIG. 5D, and FIG. 5E, the second end of the fifth transistor is connected to the first transfer line through the fifth hole 431 and the sixth hole 432 in sequence, the first transfer line is connected to a first end of the second control circuit (that is, the first transistor T1) through a seventh hole 433 and an eighth hole 434 in sequence, an orthographic projection of the fifth hole 431 on the base substrate and an orthographic projection of the sixth hole 432 on the base substrate are adjacent to each other, the fifth hole 431 and the sixth hole 432 are distributed along the first direction X, an orthographic projection of the seventh hole 433 on the base substrate and an orthographic projection of the eighth hole 434 on the base substrate are adjacent to each other, and the seventh hole 433 and the eighth hole 434 are distributed along the second direction Y.

As illustrated in FIG. 4 and FIG. 5D, the orthographic projection of the fifth hole 431 on the base substrate and the orthographic projection of the sixth hole 432 on the base substrate are located between the orthographic projection of the third transistor T3 on the base substrate and the light-emitting control line EM, and the orthographic projection of the seventh hole 433 on the base substrate and the orthographic projection of the eighth hole 434 on the base substrate are located between the third scan line G3 and the initial signal line 401.

In some embodiments of the present disclosure, the light-emitting control circuit includes a fifth transistor, each selected from a group consisting of the first transistor, the second transistor, the third transistor, the fourth transistor, and the fifth transistors comprises an active layer, orthographic projections of the active layers of the first transistor, the second transistor, the third transistor, the fourth transistor, and the fifth transistor on the base substrate form a transistor pattern, and transistor patterns of every two adjacent sub-pixels in the same row of the plurality of sub-pixels are mirror-symmetrical.

As illustrated in FIG. 5A, the orthographic projections of the active layer 421 of the fourth transistor, the active layer 422 of the third transistor, the active layer 423 of the fifth transistor, the active layer 424 of the second transistor, and the active layer 425 of the first transistor on the base substrate form a transistor pattern, and the transistor patterns of every two adjacent sub-pixels in the same row of sub-pixels are mirror-symmetrical.

The embodiments of the present disclosure are further described below with reference to FIG. 4 and FIG. 5A to FIG. 5Q.

For example, as illustrated in FIG. 4, the reference voltage bridging line Vref, the second scan line G2, the first scan line G1, the control signal line EM, and the third scan line G3 extend along the first direction X and are arranged along the second direction Y which is not parallel to the first direction X.

For example, the first direction X and the second direction Y are perpendicular to each other. For example, the first direction X is parallel to the row direction of the pixel array, and the second direction Y is parallel to the column direction of the pixel array.

For example, as illustrated in FIG. 4, in the second direction Y, the fourth transistor T4 is located between the first scan line G1 and the second scan line G2, and the projection of the active layer of the fourth transistor T4 on the base substrate is parallel to the first direction X. The third transistor T3 is located between the first scan line G1 and the control signal line EM, and the projection of the active layer of the third transistor T3 on the base substrate is parallel to the first direction X.

For example, as illustrated in FIG. 4, the orthographic projection of the storage capacitor Cst on the base substrate is located between the orthographic projection of the control signal line EM on the base substrate and the orthographic projection of the third scan line G3 on the base substrate.

For example, various portions, overlapping the active semiconductor layer 410, of the first conductive layer 420 are illustrated in FIG. 5C. The reference voltage bridging line Vref is located in the active semiconductor layer 410, and the second scan line G2, the first scan line G1, the control signal line EM, and the third scan line G3 are all located in the first conductive layer 420. As illustrated in FIG. 5A, FIG. 5B, and FIG. 5C, for example, the second scan line G2 overlaps with the active semiconductor layer 410 to define the active layer 421 of the fourth transistor T4, the first scan line G1 overlaps with the active semiconductor layer 410 to define the active layer 422 of the third transistor T3, the control signal line EM overlaps with the active semiconductor layer 410 to define the active layer 423 of the fifth transistor, the first capacitor plate Cst-1 overlaps with the active semiconductor layer 410 to define the active layer 424 of the second transistor, and the third scan line G3 overlaps with the active semiconductor layer 410 to define the active layer 425 of the first transistor T1.

For example, as illustrated in FIG. 4 and FIG. 5A, the active layer 424 of the second transistor T2 and the active layer 423 of the light-emitting control transistor T5 are integrally formed.

FIG. 5A illustrates the active semiconductor layer 410 of the plurality of pixel circuits, and the active semiconductor layer 410 may be formed on the base substrate by patterning a semiconductor material. The active semiconductor layer 410 may be used to manufacture the active layers of the first to fifth transistors T1 to T5, and each active layer may include a source region, a drain region, and a channel region between the source region and the drain region. The channel region is used to form the channel of the transistor.

For example, as illustrated in FIG. 5A, the active layers of the respective transistors T1-T5 are provided on the same layer, and the fifth transistor T5 and the second transistor T2 are provided integrally.

For example, as illustrated in FIG. 5A, in the second direction Y, the active layer 421 of the fourth transistor T4, the active layer 422 of the third transistor T3, and the active layer 423 of the fifth transistor T5 are located on the first side of the active layer 424 of the second transistor T2, and active layer 425 of the first transistor T1 is located on the second side of the active layer 424 of the second transistor T2. For example, the active semiconductor layer 410 can be made of amorphous silicon, polysilicon, oxide semiconductor materials, and the like. It should be noted that, the above-mentioned source region and drain region may be regions doped with n-type impurities or p-type impurities. In the embodiments of the present disclosure, the doped source region corresponds to the source electrode of the transistor (e.g., the first electrode of the transistor), and the doped drain region corresponds to the drain electrode of the transistor (e.g., the second electrode of the transistor).

For example, a first insulating layer (not illustrated) is formed on the side of the above-mentioned active semiconductor layer 410 away from the base substrate to protect the above-mentioned active semiconductor layer 410.

FIG. 5B illustrates the first conductive layer 420 of the pixel circuit, the first conductive layer 420 is disposed on the side of the first insulating layer away from the active semiconductor layer 410 so as to be insulated from the active semiconductor layer 410.

For example, the first to third scan lines G1 to G3, the control signal line EM, and the first voltage bridging line 305 are all located in the first conductive layer 420. In addition, the first conductive layer 420 may further include the first electrode plate Cst-1 of the storage capacitor Cst and the gate electrodes of the first to fifth transistors T1 to T5.

For example, as illustrated in FIG. 5B, the first scan line G1, the second scan line G2, the control signal line EM, the third scan line G3, and the first voltage bridging line 305 all substantially extend along the first direction X. In the second direction Y, the second scan line G2, the first scan line G1, the control signal line EM, the third scan line G3, and the first voltage bridging line 305 are arranged in sequence.

For example, as illustrated in FIG. 5B, each selected from a group consisting of the first scan line G1, the second scan line G2, the control signal line EM, the third scan line G3, and the first voltage bridging line 305 corresponding to the respective pixel circuits of each row of sub-pixels is a continuous straight line.

For example, the second scan line G2 is electrically connected to the gate electrode of the fourth transistor T4 for controlling the fourth transistor T4 to be turned on or turned off: and the first scan line G1 is electrically connected to the gate electrode of the third transistor T3 for controlling the third transistor T3 to be turned on or turned off.

FIG. 5C is a schematic diagram of the stacking positional relationship of the active semiconductor layer 410 and the first conductive layer 420.

For example, as illustrated in FIG. 5C, in the direction perpendicular to the base substrate, the portion, covered by the first electrode plate Cst-1 of the storage capacitor Cst in the first conductive layer 420, of the active semiconductor layer 410 is the active layer 424 of the second transistor T2.

For example, the first transistor T1 includes an active layer 425, and the active layer 425 includes a first channel 4251 and a second channel 4252. For example, as illustrated in FIG. 5C, the direction of the first channel 4251 is parallel to the second direction Y, and the direction of the second channel 4252 is parallel to the first direction X.

FIG. 5D is a schematic diagram of the stacking positional relationship of the active semiconductor layer 410, the first conductive layer 420, and the second insulating layer.

For example, a second insulating layer is formed on the side of the above-mentioned first conductive layer 420 away from the first insulating layer, so as to protect the above-mentioned first conductive layer 420.

As illustrated in FIG. 5D, the second insulating layer includes a plurality of holes. For example, the hole 4342 and the hole 4341 are connected through a first connection line to connect the fourth transistor T4 with the reference voltage bridging line Vref. The hole 4348 is connected to the hole corresponding to the point G through the first bridging line 407 and the fourth hole 416. The hole 4343 is connected with the data signal line (e.g., Data_R). The second end of the fifth transistor T5 is connected to the first transfer line through the fifth hole 431 and the sixth hole 432 in sequence, the first transfer line is connected to the first end of the first transistor T1 through the seventh hole 433 and the eighth hole 434 in sequence, the orthographic projections of the fifth hole 431 and the sixth hole 432 on the base substrate are adjacent to each other, the fifth hole 431 and the sixth hole 432 are distributed along the first direction X, the orthographic projections of the seventh hole 433 and the eighth hole 434 on the base substrate are adjacent to each other, and the seventh hole 433 and the eighth hole 434 are distributed along the first direction X. The hole 4345 and the hole 4346 are used to connect the second end of the first transistor T1 with the initial signal line 401. The hole 4347 is connected to the second hole 403 on the first voltage bridging line 305 to receive the first voltage from the first voltage bridging line 305.

FIG. 5E illustrates the first source-drain metal layer 490.

As illustrated in FIG. 5E, the first voltage main line VDD, the reference voltage main line 405, the first bridging portion 407, and the first voltage transfer portion 402 are all distributed in the first source-drain metal layer 490.

FIG. 5F is a schematic diagram of the stacking positional relationship of the active semiconductor layer 410, the first conductive layer 420, and the first source-drain metal layer 490.

For example, a second insulating layer (not illustrated) is formed on the side of the above-mentioned first conductive layer 420 away from the first insulating layer, so as to protect the above-mentioned first conductive layer 420. The first source-drain metal layer 490 is formed on a side of the second insulating layer away from the first conductive layer 420.

FIG. 5G is a schematic diagram of the second conductive layer 440.

The second conductive layer 440 may be located between the first source-drain metal layer 490 and the third insulating layer 460 (illustrated in FIG. 5H).

As illustrated in FIG. 5G, the second conductive layer 440 includes the second electrode plate Cst-2 of the storage capacitor Cst and the initial signal line 401. As illustrated in FIG. 5F, the initial signal line 401 extends along the first direction X and is arranged along the second direction Y, in the direction perpendicular to the base substrate, the first electrode plate Cst-1 of the storage capacitor Cst and the second electrode plate Cst-2 of the storage capacitor Cst at least partially overlap to form the storage capacitor Cst.

FIG. 5H is a schematic diagram of the third insulating layer 460.

The third insulating layer 460 may be located between the first source-drain metal layer 490 and the second conductive layer 440, thereby insulating the second conductive layer 440 from the first source-drain metal layer 490.

As illustrated in FIG. 5H, a plurality of holes 455 are distributed in the third insulating layer, and these holes 455 are used to connect the OLED. The third insulating layer may be made of, for example, a resin material.

FIG. 5I is a schematic diagram of the stacking positional relationship of the active semiconductor layer 410, the first conductive layer 420, the first source-drain metal layer 490, and the third insulating layer.

FIG. 5J is a schematic diagram of the second source-drain metal layer 470.

As illustrated in FIG. 5J, an anode connection portion 471 is distributed in the second source-drain metal layer 470.

FIG. 5K is a schematic diagram of the stacking positional relationship of the active semiconductor layer 410, the first conductive layer 420, the first source-drain metal layer 490, the third insulating layer, and the second source-drain metal layer 470.

For example, the first electrode of the light-emitting element 20 is connected to the first end of the second control circuit (i.e., the first transistor T1) through the anode connection portion 471. For example, the first electrode of the light-emitting element 20 may be an anode, and the second electrode of the light-emitting element 20 may be a cathode.

As illustrated in FIG. 5K, the anode connection portion 471 extends along the second direction Y, the anode connection portion 471 includes a first end and a second end, the first end of the anode connection portion 471 is located on the side of the third scan line G3 close to the first capacitor plate Cst-1, the second end of the anode connection portion 471 is located on the side of the third scan line G3 away from the first capacitor plate Cst-1, the first end of the anode connection portion 471 is connected to the first end of the second control circuit (i.e., the first transistor T1) through the ninth hole, and the orthographic projection of the anode connection portion 471 on the base substrate overlaps the orthographic projection of the third scan line G3 on the base substrate.

FIG. 5L is a schematic diagram of the distribution of the ninth holes 4350 on the base substrate.

FIG. 5M is a schematic diagram illustrating the positional relationship of the active semiconductor layer 410, the first conductive layer 420, the first source-drain metal layer 490, the third insulating layer, the second source-drain metal layer 470, and the ninth holes 4350.

FIG. 5N illustrates the anode layer 480 of the pixel circuit, and the anode layer 480 includes the first electrode (i.e., the anode) 481 of the light-emitting element.

FIG. 5O is a schematic diagram of the stacking positional relationship of the active semiconductor layer 410, the first conductive layer 420, the first source-drain metal layer 490, the third insulating layer, the second source-drain metal layer 470, and the anode layer 480.

As illustrated in FIG. 5O, the first electrode 481 of the light-emitting element covers the corresponding sub-pixel.

In some embodiments of the present disclosure, on the basis of the foregoing embodiments, the display substrate may further include a pixel define layer (PDL).

FIG. 5P is a schematic diagram of the distribution of the PDL 491 on the base substrate.

FIG. 5Q is a schematic diagram illustrating the stacking positional relationship of the active semiconductor layer 410, the first conductive layer 420, the first source-drain metal layer 490, the third insulating layer, the second source-drain metal layer 470, the anode layer 480, and the PDL 491.

The pixel define layer may be located on a side of the anode layer 480 away from the second source-drain metal layer 470. The pixel define layer can avoid color mixing of the anode layers of adjacent light-emitting elements, so that the controllability of the settings of the areas, shapes, and arrangement of the sub-pixels is high. For example, the pattern corresponding to each sub-pixel defined by the pixel define layer may be an ellipse, a rectangle, a square, or any other shape, for example, can also be a shape composed of two straight lines and two semicircular arcs (as illustrated in FIG. 5P and FIG. 5Q), and the two ends of each semicircular arc are respectively connected with the straight line to form a closed pattern, the shape of which is similar to the shape of a racetrack.

It should be noted that, in the embodiments of the present disclosure, the display substrate may further include more layer structures, and is not limited to the respective layer structures described above, and the positional relationship of the respective layer structures in the display substrate is not limited and can be determined according to actual requirements.

Figure 6:
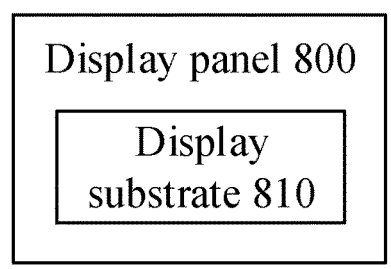
FIG. 6 is a schematic diagram of a display panel provided by at least one embodiment of the present disclosure.

At least one embodiment of the present disclosure also provides a display panel. FIG. 6 is a schematic diagram of a display panel provided by at least one embodiment of the present disclosure. As illustrated in FIG. 6, the display panel 800 includes the display substrate 810 provided by any embodiment of the present disclosure. The display substrate 810 may be, for example, the display substrate 100 or 300 illustrated in FIG. 1A and FIG. 3 to FIG. 5Q.

For example, the display panel 800 may be an organic light-emitting diode (OLED) display panel or the like. When the display panel 800 is an organic light-emitting diode display panel, the display substrate 810 may be an array substrate.

For example, the display panel 800 may be a rectangular panel, a circular panel, an oval panel, a polygonal panel, or the like. In addition, the display panel 800 can be not only a flat panel, but also a curved panel, or even a spherical panel.

For example, the display panel 800 may also have a touch function, that is, the display panel 800 may be a touch display panel.

For example, the display panel 800 can be applied to any product or component with a display function, such as a mobile phone, a tablet computer, a television, a monitor, a notebook computer, a digital photo frame, a navigator, and the like.

For example, the display panel 800 may be a flexible display panel, so as to meet various practical application requirements, for example, the display panel 800 may be applied to a curved screen and the like.

It should be noted that the display panel 800 may further include other components, such as a data driving circuit, a timing controller, and the like, and the embodiments of the present disclosure do not limit this. For the sake of clarity and conciseness, the embodiments of the present disclosure do not provide all the constituent units of the display panel 800. In order to achieve the basic functions of the display panel 800, those skilled in the art may provide or set other structures not illustrated according to specific needs, and the embodiments of the present disclosure are not limited thereto.

Regarding the technical effects of the display panel 800 provided by the above embodiments, reference may be made to the technical effects of the display substrate provided in the embodiments of the present disclosure, which will not be repeated here.

Regarding the present disclosure, the following statements should be noted.

(1) The accompanying drawings involve only the structure(s) in connection with the embodiment(s) of the present disclosure, and other structure(s) can be referred to common design(s).

(2) In the drawings used to describe the embodiments of the present disclosure, the thicknesses and dimensions of layers or structures are exaggerated for clarity. It should be understood that when an element such as a layer, film, region or substrate is referred to as being "on" or "under" another element, it can be "directly on" or "directly under" the other element, or intermediate elements may be present.

(3) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto. The protection scope of the present disclosure should be based on the protection scope of the claims.

What is claimed is:

1. A display substrate, comprising:
   a base substrate; and
   a plurality of sub-pixels on the base substrate,
   wherein the plurality of sub-pixels are arranged in a plurality of rows and a plurality of columns, each sub-pixel comprises a light-emitting element and a pixel circuit for driving the light-emitting element to emit light, and the light-emitting element is configured to emit light according to a driving current that is received;
   the pixel circuit comprises a driving circuit, a data writing circuit, a storage circuit, a first control circuit, a second control circuit, and a light-emitting control circuit;
   the driving circuit comprises a control end, a first end, and a second end, and is configured to control the driving current flowing through the light-emitting element, the first end of the driving circuit receives a first voltage of a first voltage line, and the second end of the driving circuit is connected to the light-emitting control circuit;
   the data writing circuit is connected to the control end of the driving circuit, and is configured to write a data signal into the control end of the driving circuit in response to a first scan signal;
   a first end of the light-emitting control circuit is connected to the second end of the driving circuit, a second end of the light-emitting control circuit is connected to a first electrode of the light-emitting element, and the light-emitting control circuit is configured to apply the driving current to the light-emitting element in response to a light-emitting control signal;
   a first end of the storage circuit is connected to the control end of the driving circuit, a second end of the storage circuit is connected to the second end of the light-emitting control circuit, and the storage circuit is configured to store the data signal written by the data writing circuit;
   the first control circuit is connected to the control end of the driving circuit, and is configured to write a reference voltage into the control end of the driving circuit in response to a second scan signal;
   the second control circuit is connected to the first electrode of the light-emitting element, and is configured to write an initial voltage into the first electrode of the light-emitting element in response to a third scan signal; and
   orthographic projections of at least part of pixel circuits of every two adjacent sub-pixels in a same row of the plurality of sub-pixels on the base substrate are mirror-symmetrical.

2. The display substrate according to claim 1, wherein the plurality of sub-pixels are divided into a plurality of pixel units, each pixel unit comprises three adjacent sub-pixels located in a same row, and each pixel unit comprises a first sub-pixel, a second sub-pixel, and a third sub-pixel arranged in sequence along a first direction;

a data writing circuit in a pixel circuit of the first sub-pixel is connected to a first data line to receive a corresponding data signal;

a data writing circuit in a pixel circuit of the second sub-pixel is connected to a second data line to receive a corresponding data signal;

a data writing circuit in a pixel circuit of the third sub-pixel is connected to a third data line to receive a corresponding data signal;

the first data line, the second data line, and the third data line are parallel to each other and extend in a second direction, and the second direction is perpendicular to the first direction; and an orthographic projection of the pixel circuit of the first sub-pixel and an orthographic projection of the pixel circuit of the second sub-pixel on the base substrate are mirror-symmetrical with respect to a center line between the first data line and the second data line, and the orthographic projection of the pixel circuit of the second sub-pixel and an orthographic projection of the pixel circuit of the third sub-pixel on the base substrate are mirror-symmetrical with respect to a center line between the second data line and the third data line.

3. The display substrate according to claim 2, wherein the first data line is on a side of the first sub-pixel away from the second sub-pixel, and the second data line and the third data line are between the second sub-pixel and the third sub-pixel; or the first data line and the second data line are between the first sub-pixel and the second sub-pixel, and the third data line is on a side of the third sub-pixel away from the second sub-pixel.

4. The display substrate according to claim 2, wherein for two pixel units that are adjacent and located in a same row, distribution positions of multi-line patterns formed by the first data line, the second data line, and the third data line in the two pixel units are mirror-symmetrical.

5. The display substrate according to claim 1, wherein the first voltage line comprises a first voltage main line and a first voltage bridging line, the first voltage main line extends along a second direction and is parallel to a first data line, a second data line, and a third data line, the first voltage bridging line extends along a first direction, the first voltage bridging line is connected to the first voltage main line through a first hole, and the first voltage bridging line is configured to provide the first voltage to two rows of the plurality of sub-pixels respectively on two sides of the first voltage bridging line and adjacent to the first voltage bridging line.

6. The display substrate according to claim 5, wherein the second control circuit comprises a first end and a second end, the first end of the second control circuit is connected to the first electrode of the light-emitting element, and the second end of the second control circuit is connected to an initial signal line to receive the initial voltage, and the initial signal line is parallel to the first voltage bridging line, and is between an orthographic projection of the first voltage bridging line on the base substrate and an orthographic projection of the second control circuit on the base substrate.

7. The display substrate according to claim 6, wherein the second control circuit comprises a first transistor, the first transistor comprises a gate electrode, and the gate electrode of the first transistor is connected to a third scan line to receive the third scan signal, the third scan line is parallel to the first voltage bridging line, and is on a side of the initial signal line away from the first voltage bridging line, the first transistor comprises an active layer, and an orthographic projection of at least portion of the active layer of the first transistor on the base substrate is between an orthographic projection of the third scan line on the base substrate and an orthographic projection of the initial signal line on the base substrate.

8. The display substrate according to claim 7, wherein the first voltage line further comprises a plurality of first voltage transfer portions, each first voltage transfer portion of the plurality of first voltage transfer portions is configured to provide the first voltage to two sub-pixels that are located in a same column, on the two sides of the first voltage bridging line, and adjacent to the first voltage bridging line, each first voltage transfer portion extends along the second direction and is connected to the first voltage bridging line through a second hole, the first voltage transfer portion comprises a first end and a second end, the first end of the first voltage transfer portion and the second end of the first voltage transfer portion are on different sides of the first voltage bridging line, the first end of the first voltage transfer portion is connected to sub-pixels on a side of the first voltage bridging line, and the second end of the first voltage transfer portion is connected to sub-pixels on another side of the first voltage bridging line.

9. The display substrate according to claim 8, wherein an orthographic projection of the first voltage transfer portion on the base substrate overlaps with the orthographic projection of the initial signal line on the base substrate and the orthographic projection of the third scan line on the base substrate.

10. The display substrate according to claim 8, wherein the light-emitting control circuit comprises a control end, and the control end of the light-emitting control circuit is connected to a control signal line to receive the light-emitting control signal, the control signal line is parallel to the first voltage bridging line, and the control signal line is on a side of the third scan line away from the first voltage bridging line.

11. The display substrate according to claim 10, wherein the control signal line and the third scan line are on different sides of an orthographic projection of the driving circuit on the base substrate.

12. The display substrate according to claim 10, wherein the storage circuit comprises a first capacitor plate and a second capacitor plate, and an orthographic projection of the first capacitor plate on the base substrate is between the orthographic projection of the third scan line on the base substrate and an orthographic projection of the control signal line on the base substrate, the orthographic projection of the first capacitor plate on the base substrate at least partially overlaps an orthographic projection of the second capacitor plate on the base substrate, the driving circuit comprises a second transistor, the second transistor comprises a gate electrode, and the first capacitor plate serves as the gate electrode of the second transistor.

13. The display substrate according to claim 12, wherein the data writing circuit comprises a control end, and the control end of the data writing circuit is connected to a first scan line to receive the first scan signal,
the first scan line is parallel to the first voltage bridging line, and the first scan line is on a side of the control signal line away from the first voltage bridging line.

14. The display substrate according to claim 13, wherein the data writing circuit comprises a third transistor, the third transistor comprises an active layer, and an orthographic projection of the active layer of the third transistor on the base substrate is between an orthographic projection of the first scan line on the base substrate and the orthographic projection of the control signal line on the base substrate.

15. The display substrate according to claim 14, wherein the first control circuit comprises a control end, and the control end of the first control circuit is connected to a second scan line to receive the second scan signal,
the second scan line is parallel to the first voltage bridging line, and the second scan line is on a side of the first scan line away from the first voltage bridging line.

16. The display substrate according to claim 15, wherein the first control circuit comprises a fourth transistor, the fourth transistor comprises an active layer, and an orthographic projection of the active layer of the fourth transistor on the base substrate is between the orthographic projection of the first scan line on the base substrate and an orthographic projection of the second scan line on the base substrate.

17. The display substrate according to claim 15, wherein the first control circuit further comprises a first end and a second end, the first end of the first control circuit is connected to a reference voltage line to receive the reference voltage, and the second end of the first control circuit is connected to the control end of the driving circuit,
the reference voltage line comprises a reference voltage main line and a reference voltage bridging line,
the reference voltage main line extends along the second direction and is parallel to the first voltage main line,
the reference voltage bridging line extends along the first direction, the reference voltage bridging line is connected to the reference voltage main line through a third hole, and the reference voltage bridging line is connected to first control circuits of a plurality of sub-pixels in a same row and is configured to provide the reference voltage to the first control circuits of the plurality of sub-pixels in the same row.

18. The display substrate according to claim 17, wherein the plurality of sub-pixels in the same row have a center line extending along the second direction, and the reference voltage main line overlaps with the center line.

19. The display substrate according to claim 18, wherein the reference voltage bridging line is configured to provide the reference voltage to respective first control circuits of six sub-pixels in a same row.

20. A display panel, comprising the display substrate according to claim 1.

* * * * *